(12) United States Patent
Kim et al.

(10) Patent No.: US 11,468,817 B1
(45) Date of Patent: Oct. 11, 2022

(54) PIXEL AND DISPLAY DEVICE INCLUDING THE SAME

(71) Applicant: Samsung Display Co., LTD., Yongin-si (KR)

(72) Inventors: Kwi Hyun Kim, Yongin-si (KR); Sang Yong No, Yongin-si (KR); Hwa Rang Lee, Yongin-si (KR); Ji Yeon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/545,449

(22) Filed: Dec. 8, 2021

(30) Foreign Application Priority Data

Apr. 27, 2021 (KR) .................. 10-2021-0054604

(51) Int. Cl.
*G09G 3/32* (2016.01)
*G09G 3/20* (2006.01)
*H01L 25/16* (2006.01)
*H01L 27/12* (2006.01)

(52) U.S. Cl.
CPC ............. *G09G 3/2007* (2013.01); *G09G 3/32* (2013.01); *G09G 2300/0426* (2013.01); *G09G 2300/0852* (2013.01); *G09G 2310/027* (2013.01); *G09G 2310/0213* (2013.01); *G09G 2310/0243* (2013.01); *G09G 2310/0267* (2013.01); *G09G 2320/0242* (2013.01);
(Continued)

(58) Field of Classification Search
CPC ...... G09G 3/2007; G09G 3/32; G09G 3/3233; G09G 3/3241; G09G 3/3258; G09G 3/325; G09G 3/3283; G09G 3/3291; G09G 2300/0426; G09G 2300/0852; G09G 2310/0213; G09G 2310/0243; G09G 2310/0267; G09G 2310/027; G09G 2320/0242; G09G 2320/045; G09G 2330/02; H01L 25/167; H01L 27/124
See application file for complete search history.

(56) References Cited

U.S. PATENT DOCUMENTS

| | | | |
|---|---|---|---|
| 8,289,263 B2 | 10/2012 | Lee et al. | |
| 11,302,236 B2 * | 4/2022 | Pyun | ..................... G09G 3/2003 |
| 11,348,532 B2 * | 5/2022 | Pyun | ..................... G09G 3/3291 |

(Continued)

FOREIGN PATENT DOCUMENTS

| | | |
|---|---|---|
| KR | 10-1288593 | 7/2013 |
| KR | 10-1327835 | 11/2013 |

(Continued)

*Primary Examiner* — Vijay Shankar
(74) *Attorney, Agent, or Firm* — Kile Park Reed & Houtteman PLLC

(57) ABSTRACT

A display device includes a data driver that outputs a first data signal and a second data signal of different voltages, and a pixel that emits light in response to the first data signal and the second data signal. The pixel includes a current generator generating a driving current corresponding to the first data signal, a first light emitting part including a first electrode, a second electrode, and a first light emitting element, a second light emitting part including a third electrode, a fourth electrode connected, and a second light emitting element, and a current controller controlling a divided current supplied to the second light emitting part in response to the second data signal.

20 Claims, 18 Drawing Sheets

(52) U.S. Cl.
CPC ... *G09G 2320/045* (2013.01); *G09G 2330/02* (2013.01); *H01L 25/167* (2013.01); *H01L 27/124* (2013.01)

(56) References Cited

U.S. PATENT DOCUMENTS

| | | | | |
|---|---|---|---|---|
| 2022/0139332 A1* | 5/2022 | Park | ................... | G09G 3/3283 |
| | | | | 345/214 |
| 2022/0157221 A1* | 5/2022 | Kim | ................... | G09G 3/2092 |
| 2022/0165209 A1* | 5/2022 | Choi | .................. | G09G 3/32 |

FOREIGN PATENT DOCUMENTS

| | | |
|---|---|---|
| KR | 10-1350410 | 1/2014 |
| KR | 10-1622649 | 5/2016 |
| KR | 10-2017-0081050 | 7/2017 |
| KR | 10-2019-0038145 | 4/2019 |
| KR | 10-2020-0011165 | 2/2020 |

\* cited by examiner

Vdata1: Vdata1_1, Vdata1_2
Vdata2: Vdata2_1, Vdata2_2

PIXEL AND DISPLAY DEVICE INCLUDING THE SAME

CROSS-REFERENCE TO RELATED APPLICATION(S)

This application claims priority to and the benefit of Korean Patent Application No. 10-2021-0054604 under 35 U.S.C. § 119, filed in the Korean Intellectual Property Office (KIPO) on Apr. 27, 2021, the entire contents of which are incorporated herein by reference.

BACKGROUND

1. Technical Field

An embodiment of the disclosure relates to a pixel and a display device including the same.

2. Description of the Related Art

Recently, interest in information display is increasing. Accordingly, research and development of a display device has been continuously conducted.

SUMMARY

A technical object of the disclosure is to provide a pixel including light emitting elements, and a display device including the pixel.

The objects of the disclosure are not limited to the above-described object, and other technical objects that are not described will be clearly understood by those skilled in the art from the following description.

A display device according to an embodiment of the disclosure may include a data driver that outputs a first data signal and a second data signal of different voltages in response to image data of each frame, and a pixel that emits light in response to the first data signal and the second data signal. The pixel may include a current generator electrically connected between a first power source and a first node and generating a driving current corresponding to the first data signal, a first light emitting part including a first electrode electrically connected to the first node, a second electrode electrically connected to a second power source, and a first light emitting element electrically connected between the first electrode and the second electrode, a second light emitting part including a third electrode electrically connected to the first node and separated from the first electrode, a fourth electrode electrically connected to the second power source, and a second light emitting element electrically connected between the third electrode and the fourth electrode, and a current controller electrically connected between the first node and the second light emitting part and controlling a divided current supplied to the second light emitting part in response to the second data signal.

In an embodiment, the data driver may change a voltage of the first data signal and a voltage of the second data signal according to a grayscale value of image data corresponding to the pixel.

In an embodiment, in case that the image data corresponding to the pixel has a first grayscale value, the data driver may generate a first voltage and a second voltage as the first data signal and the second data signal, respectively, in case that the image data corresponding to the pixel has a second grayscale value greater than the first grayscale value, the data driver may generate a third voltage and a fourth voltage as the first data signal and the second data signal, respectively, an amplitude of the third voltage may be greater than an amplitude of the first voltage, and an amplitude of the fourth voltage may be greater than an amplitude of the second voltage.

In an embodiment, the data driver may generate the first data signal using the image data and a first gamma voltage, and generate the second data signal using the image data and a second gamma voltage.

In an embodiment, the current generator may include a first transistor electrically connected between the first power source and the first node and generating the driving current in response to a voltage of a second node, a second transistor electrically connected between a first data line to which the first data signal is supplied and the second node, and turned on by a first scan signal, a third transistor electrically connected between the first node and an initialization power line, and turned on by the first scan signal or a control signal, and a first capacitor electrically connected between the first node and the second node.

In an embodiment, the current controller may include a fourth transistor electrically connected between the first node and the second light emitting part and controlling the divided current in response to a voltage of a third node, a fifth transistor that supplies the second data signal to the third node, and a second capacitor electrically connected between an electrode of the fourth transistor and the third node.

In an embodiment, the fifth transistor may be electrically connected between a second data line to which the second data signal is supplied and the third node, and may be turned on by the first scan signal.

In an embodiment, the fifth transistor may be electrically connected between the first data line and the third node, and may be turned on by a second scan signal.

In an embodiment, the display device may further include a first scan line electrically connected to a gate electrode of the second transistor, a second scan line electrically connected to a gate electrode of the fifth transistor, and a scan driver sequentially outputting the first scan signal and the second scan signal to the first scan line and the second scan line.

In an embodiment, the data driver may sequentially output the first data signal and the second data signal to the first data line.

In an embodiment, the data driver may generate the second data signal as an off-voltage of the fourth transistor in case that a grayscale value of image data corresponding to the pixel is equal to or less than a reference grayscale value.

In an embodiment, the second electrode and the fourth electrode may be integral with each other.

In an embodiment, the second power source may include a first sub-power source supplying second power of a first potential and a second sub-power source supplying second power of a second potential lower than the first potential, and the second electrode and the fourth electrode may be separated from each other and may be electrically connected to the first sub-power source and the second sub-power source, respectively.

A pixel according to an embodiment of the disclosure may include a current generator electrically connected between a first power source and a first node and generating a driving current corresponding to a first data signal, a first light emitting part including a first electrode electrically connected to the first node, a second electrode electrically connected to a second power source, and a first light emitting element electrically connected between the first electrode and the second electrode, a second light emitting part including a third electrode electrically connected to the first node and separated from the first electrode, a fourth electrode electrically connected to the second power source, and a second light emitting element electrically connected between the third electrode and the fourth electrode, and a current controller electrically connected between the first node and the second light emitting part and controlling a divided current supplied to the second light emitting part in response to a second data signal.

In an embodiment, the current generator may include a first transistor electrically connected between the first power source and the first node and generating the driving current in response to a voltage of a second node, a second transistor electrically connected between a first data line to which the first data signal is supplied and the second node, and turned on by a first scan signal, a third transistor electrically connected between the first node and an initialization power line, and turned on by the first scan signal or a control signal, and a first capacitor electrically connected between the first node and the second node.

In an embodiment, the current controller may include a fourth transistor electrically connected between the first node and the second light emitting part and controlling the divided current in response to a voltage of a third node, a fifth transistor that supplies the second data signal to the third node, and a second capacitor electrically connected between an electrode of the fourth transistor and the third node.

In an embodiment, the fifth transistor may be electrically connected between a second data line to which the second data signal is supplied and the third node, and may be turned on by the first scan signal.

In an embodiment, the fifth transistor may be electrically connected between the first data line and the third node, and may be turned on by a second scan signal.

In an embodiment, the second electrode and the fourth electrode may be integral with each other.

In an embodiment, the second power source may include a first sub-power source supplying second power of a first potential and a second sub-power source supplying second power of a second potential lower than the first potential, and the second electrode and the fourth electrode may be separated from each other and may be electrically connected to the first sub-power source and the second sub-power source, respectively.

Details of other embodiments are included in the detailed description and drawings.

The pixel according to an embodiment of the disclosure may include the first light emitting part including the first light emitting element and the second light emitting part including the second light emitting element, and a ratio of a current flowing through the first light emitting part and the second light emitting part may be adjusted according to the grayscale value of the image data corresponding to the pixel. Accordingly, even though the pixel is driven with a low luminance, reduction of light emission efficiency and a color shift of the pixel may be prevented or reduced.

In addition, in an embodiment of the disclosure, in case that the pixel is driven with a high luminance, a ratio of the divided current supplied to the second light emitting part may be further increased. Accordingly, a stress according to light emission of the pixel may be distributed to the first and second light emitting parts, and deterioration of the first and second light emitting elements may be uniform. Accordingly, an image quality reduction of the display device according to the deterioration of the pixel may be improved.

An effect according to the embodiments are not limited by the contents illustrated above, and more various effects are included in the present specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
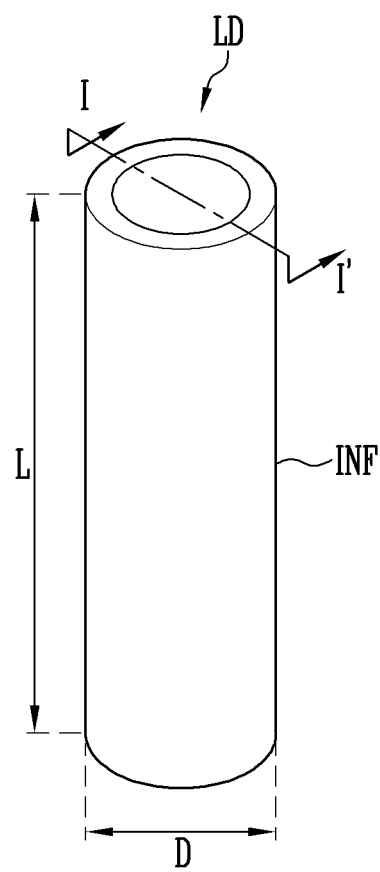
FIG. 1 is a perspective view schematically illustrating a light emitting element according to an embodiment of the disclosure.

The disclosure may be modified in various ways and may have various forms, and specific embodiments will be illustrated in the drawings and described in detail herein. In the following description, the singular forms also include the plural meanings unless the context clearly includes the singular.

Meanwhile, the disclosure is not limited to the embodiments disclosed below, and may be modified in various forms and may be implemented. Each of the embodiments disclosed below may be implemented alone or in combination with at least one of other embodiments.

In the drawings, some components which are not directly related to a characteristic of the disclosure may be omitted to clearly represent the disclosure. Throughout the drawings, the same or similar components will be given by the same reference numerals and symbols as much as possible even though they are shown in different drawings, and repetitive descriptions will be omitted.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
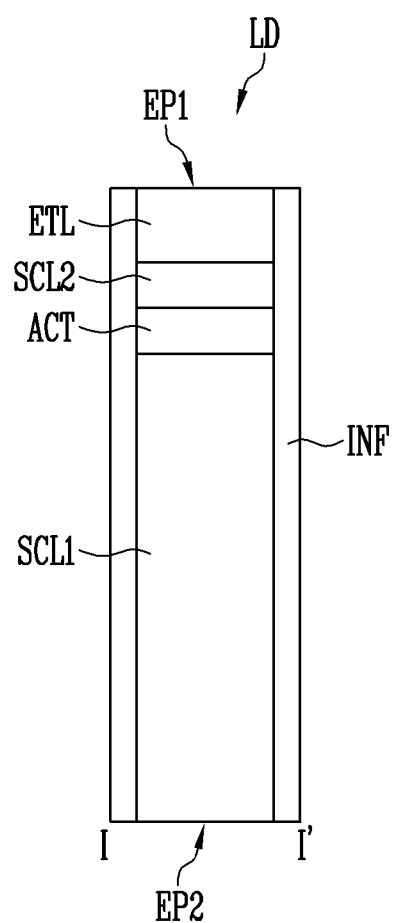
FIG. 2 is a cross-sectional view schematically illustrating the light emitting element according to an embodiment of the disclosure.

FIG. 1 is a schematic perspective view illustrating a light emitting element LD according to an embodiment. FIG. 2 is a schematic cross-sectional view illustrating the light emitting element LD according to an embodiment. For example, FIG. 1 illustrates an example of the light emitting element LD that may be used as a light source of a pixel according to an embodiment, and FIG. 2 illustrates an example of a cross-section of the light emitting element LD taken along line I-I' of FIG. 1.

Referring to FIGS. 1 and 2, the light emitting element LD may include a first semiconductor layer SCL1, an active layer ACT, and a second semiconductor layer SCL2 which are sequentially disposed in a direction (for example, a length direction), and an insulating film INF surrounding an outer circumferential surface (for example, a side surface) of the first semiconductor layer SCL1, the active layer ACT, and the second semiconductor layer SCL2. The light emitting element LD may selectively further include an electrode layer ETL disposed on the second semiconductor layer SCL2. In this case, the insulating film INF may or may not at least partially surround an outer circumferential surface of the electrode layer ETL. According to an embodiment, the light emitting element LD may further include another electrode layer disposed on a surface (for example, a lower surface) of the first semiconductor layer SCL1.

In an embodiment, the light emitting element LD is provided in a bar (or rod) shape extending in a direction and may have a first end portion EP1 and a second end portion EP2 at both ends thereof in a length direction (or a thickness direction). The first end portion EP1 may include a first bottom surface (or an upper surface) and/or a peripheral region thereof of the light emitting element LD, and the second end portion EP2 may include a second bottom surface (or a lower surface) and/or a peripheral region thereof of the light emitting element LD. For example, the electrode layer ETL and/or the second semiconductor layer SCL2 may be disposed on the first end portion EP1 of the light emitting element LD, and the first semiconductor layer SCL1 and/or at least one electrode layer electrically connected to the first semiconductor layer SCL1 may be disposed on the second end portion EP2 of the light emitting element LD.

In describing an embodiment, the term "bar shape" may include a rod-like shape or a bar-like shape having an aspect ratio greater than 1, such as a circular column or a polygonal column, and a shape of a cross section thereof is not particularly limited. For example, a length L of the light emitting element LD may be greater than a diameter D (or a width of the cross section) thereof.

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. For example, the first semiconductor layer SCL1 may be disposed on the second end portion EP2 of the light emitting element LD, and the electrode layer ETL may be disposed on the first end portion EP1 of the light emitting element LD. As another example, at least one other electrode layer may be disposed on the second end portion EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include a semiconductor material among InAlGaN, GaN, AlGaN, InGaN, AlN, and InN and may be an N-type semiconductor layer doped with a dopant such as Si, Ge, or Sn. However, the material configuring the first semiconductor layer SCL1 is not limited thereto, and various materials in addition to the above-described materials may configure the first semiconductor layer SCL1.

The active layer ACT may be disposed on the first semiconductor layer SCL1 and may be formed in a single-quantum well or multi-quantum well structure. A position of the active layer ACT may be variously changed according to a type of the light emitting element LD. In an embodiment, the active layer ACT may emit light having a wavelength of about 400 nm to about 900 nm and may have a double hetero-structure.

A clad layer (not shown) doped with a conductive dopant may be selectively formed on and/or under the active layer ACT. For example, the clad layer may be formed of an AlGaN layer or an InAlGaN layer. According to an embodiment, a material such as AlGaN or AlInGaN may be used to form the active layer ACT, and various materials in addition to the above-described materials may configure the active layer ACT.

In case that a voltage equal to or greater than a threshold voltage is applied to both ends of the light emitting element LD, the light emitting element LD emits light while electron-hole pairs are combined in the active layer ACT. Accordingly, the light emitting element LD may be used as a light source of various light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN and may be a P-type semiconductor layer doped with a dopant such as Mg. However, the material configuring the second semiconductor layer SCL2 is not limited thereto, and various materials in addition to the above-described materials may configure the second semiconductor layer SCL2.

In an embodiment, the first semiconductor layer SCL1 and the second semiconductor layer SCL2 may have different lengths (or thicknesses) in the length direction of the light emitting element LD. For example, the first semiconductor layer SCL1 may have a length (or a thickness) longer (or greater) than that of the second semiconductor layer SCL2 in the length direction of the light emitting element LD. Accordingly, the active layer ACT may be positioned closer to the first end portion EP1 than the second end portion EP2.

The electrode layer ETL may be disposed on the second semiconductor layer SCL2. The electrode layer ETL may protect the second semiconductor layer SCL2 and may be an electrode for smoothly electrically connecting the second semiconductor layer SCL2 to a predetermined electrode, line, or the like. For example, the electrode layer ETL may be an ohmic contact electrode or a Schottky contact electrode.

In describing embodiments of the disclosure, the term "connection (or coupling)" may mean a physical and/or electrical connection (or coupling) generically. In addition, this may mean a direct or indirect connection (or access) and an integral or non-integral connection (or coupling) generically.

The electrode layer ETL may be substantially transparent or translucent. Accordingly, light generated by the light emitting element LD may pass through the electrode layer ETL and may be emitted to the outside of the light emitting element LD. In another embodiment, in case that the light generated by the light emitting element LD does not pass through the electrode layer ETL and is emitted to the outside of the light emitting element LD, the electrode layer ETL may be formed to be opaque.

In an embodiment, the electrode layer ETL may include metal or metal oxide. For example, the electrode layer ETL may be formed using a metal such as chromium (Cr), titanium (Ti), aluminum (Al), gold (Au), nickel (Ni), or copper (Cu), oxide or alloy thereof, a transparent conductive material such as indium tin oxide (ITO), indium zinc oxide (IZO), indium tin zinc oxide (ITZO), zinc oxide (ZnO), or indium oxide ($In_2O_3$), and the like alone or in combination.

The insulating film INF may expose the electrode layer ETL (or the second semiconductor layer SCL2) and the first semiconductor layer SCL1 (or another electrode layer provided on the second end portion EP2 of the light emitting element LD), respectively, at the first and second end portions EP1 and EP2 of the light emitting element LD. For example, the insulating film INF may not be provided on bottom surfaces corresponding to the first and second end portions EP1 and EP2 of the light emitting element LD.

In case that the insulating film INF is provided to cover a surface of the light emitting element LD, particularly the outer circumferential surface of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured.

In case that the insulating film INF is provided on the surface of the light emitting element LD, a surface defect of the light emitting element LD may be minimized, and thus the lifespan and efficiency may be improved. In case that the insulating film INF is provided on each light emitting element LD, even though light emitting elements LD are disposed close to each other, occurrence of a short defect between the light emitting elements LD may be prevented.

In an embodiment, the light emitting element LD may be manufactured by a surface treatment process. For example, the surface treatment may be performed on the light emitting element LD using a hydrophobic material.

The insulating film INF may include a transparent insulating material. Accordingly, light generated in the active layer ACT may pass through the insulating film INF and may be emitted to the outside of the light emitting element LD. For example, the insulating film INF may include at least one insulating material of $SiO_2$ or silicon oxide ($SiO_x$), $Si_3N_4$ or silicon nitride ($SiN_x$), $Al_2O_3$ or aluminum oxide ($Al_xO_y$), and $TiO_2$ or titanium oxide ($Ti_xO_y$), where x and y are natural numbers, but a material of the insulating film INF is not limited thereto.

The insulating film INF may be configured of a single layer or multiple layers. For example, the insulating film INF may be formed of a double film.

In an embodiment, the insulating film INF may be partially etched (or removed) in a region corresponding to at least one of the first end portion EP1 and the second end portion EP2 of the light emitting element LD. For example, the insulating film INF may be etched to have a rounded shape in the at least one region, but the shape of the insulating film INF is not limited thereto.

In an embodiment, the light emitting element LD may have a small size of a range from nanometer to micrometer. For example, each light emitting element LD may have the diameter D (or a width of a cross section) and/or the length L of the range from nanometer to micrometer. For example, the light emitting element LD may have the diameter D of a range of several hundred nanometers and the length L of a range of several micrometers. However, a size of the light emitting element LD may be changed.

A structure, a shape, and/or a type of the light emitting element LD may be changed according to an embodiment. For example, the light emitting element LD may be formed in another structure and/or shape such as a core-shell structure.

A light emitting device including the light emitting element LD may be used in various types of devices that require a light source. For example, light emitting elements LD may be arranged in a pixel of the display device, and the light emitting elements LD may be used as a light source of the pixel. The light emitting element LD may be used in other types of devices that require a light source, such as a lighting device.

Figure 3:
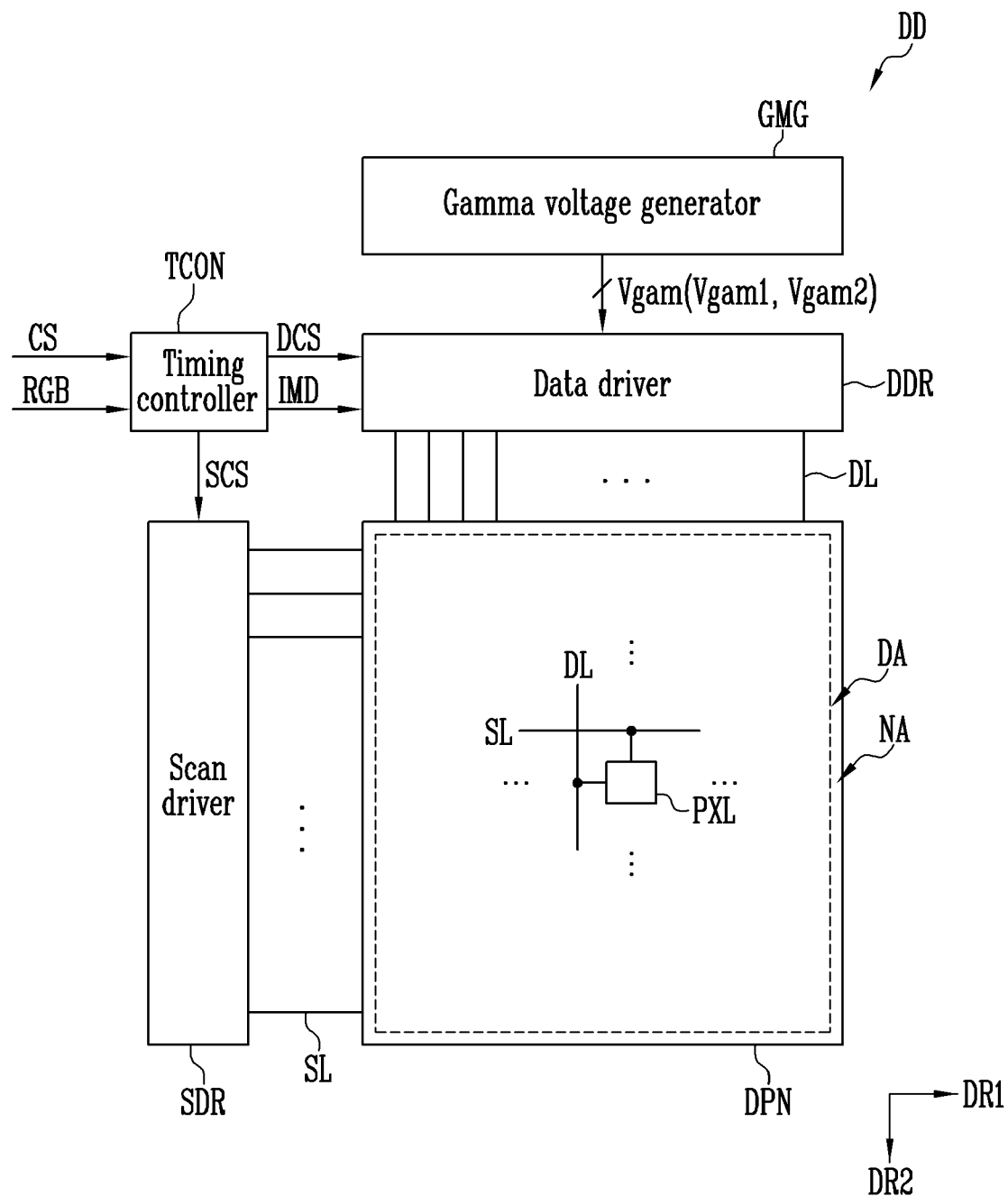
FIG. 3 is a block diagram schematically illustrating a display device according to an embodiment of the disclosure.
Figure 4:
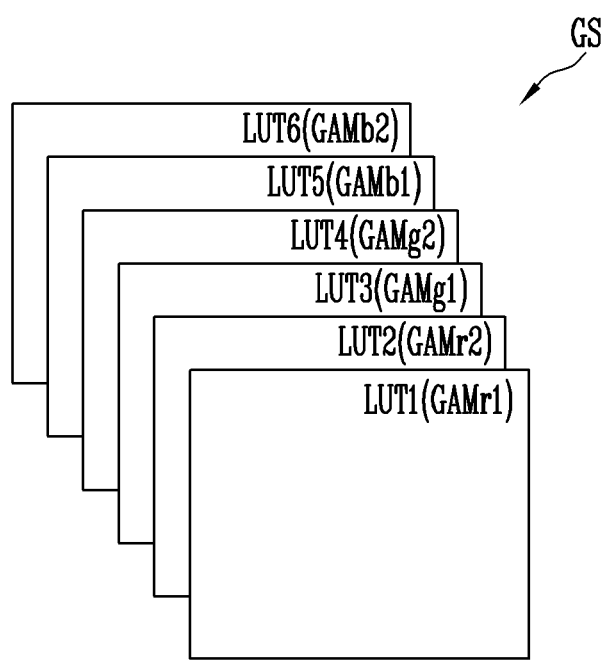
FIG. 4 is a block diagram schematically illustrating a gamma storage unit according to an embodiment of the disclosure.

FIG. 3 is a schematic block diagram illustrating a display device DD according to an embodiment. FIG. 4 is a schematic block diagram illustrating a gamma storage unit (or gamma storage part) GS according to an embodiment. In an embodiment, the gamma storage part GS of FIG. 4 may be provided to a gamma voltage generator GMG of FIG. 3, but the disclosure is not limited thereto. For example, the gamma storage part GS of FIG. 4 may be provided to a timing controller TCON of FIG. 3 or the like.

Referring to FIG. 3, the display device DD may include a display panel DPN including pixels PXL and a driving circuit for driving the pixels PXL. The driving circuit may include a scan driver SDR, a data driver DDR, the gamma voltage generator GMG, and the timing controller TCON. In FIG. 3, the display panel DPN, the scan driver SDR, the data driver DDR, the gamma voltage generator GMG, and the timing controller TCON are shown as separate configurations, but the disclosure is not limited thereto. For example, the display panel DPN, the scan driver SDR, the data driver DDR, the gamma voltage generator GMG, and/or the timing controller TCON may be integrated into one panel and/or driving IC and manufactured.

The display panel DPN may include a display area DA. The display area DA may include scan lines SL, data lines DL, and the pixels PXL electrically connected to the scan lines SL and the data lines DL.

The scan lines SL may electrically connect the scan driver SDR and the pixels PXL. Accordingly, scan signals output from the scan driver SDR may be transmitted to the pixels PXL through the scan lines SL. A driving timing (for example, a data programming period in which first and second data signals are input to each of the pixels PXL) of the pixels PXL may be controlled by the scan signals.

The data lines DL may electrically connect the data driver DDR and the pixels PXL. Accordingly, the first and second data signals output from the data driver DDR may be transmitted to the pixels PXL through the data lines DL. Light emission of the pixels PXL may be controlled using the first and second data signals.

The pixels PXL may be arranged in the display area DA. In an embodiment, the pixels PXL may be arranged in the display area DA in matrix form, and the display area DA may include horizontal lines and vertical lines intersecting each other.

Each horizontal line may include a pixel row including pixels PXL arranged in a first direction DR1 (for example, a horizontal direction) and may further include at least one signal line electrically connected to the pixels PXL of the pixel row. For example, each horizontal line may include at least one scan line SL electrically connected to the pixels PXL of a corresponding pixel row.

Each vertical line may include a pixel column including pixels PXL arranged in a second direction DR2 (for example, a vertical direction) and may further include at least one signal line electrically connected to the pixels PXL of the pixel column. For example, each vertical line may include at least one data line DL electrically connected to the pixels PXL of a corresponding pixel column.

In an embodiment, each vertical line may include data lines DL. For example, each vertical line may include data lines DL corresponding to a type and/or color of the pixels PXL arranged in a corresponding pixel column, and/or data lines DL electrically connected to each pixel PXL.

An arrangement structure, a direction, and the like of the pixels PXL arranged in the display area DA may be variously changed according to an embodiment.

Each pixel PXL may be electrically connected to at least one scan line SL and at least one data line DL and may receive a first scan signal, the first data signal, and the second data signal during each frame period. Each pixel PXL may selectively further receive a second scan signal during each frame period.

Each pixel PXL may be further electrically connected to at least one signal line and/or at least one power line. For example, each pixel PXL may be further electrically connected to a first power line, a second power line, an initialization power line, and/or a control line.

In cast that the first scan signal and/or the second scan signal is supplied from the scan lines SL, the pixels PXL may receive respective first and second data signals through the data lines DL. Each pixel PXL may emit light in response to the first and second data signals supplied to the pixel PXL in each emission period of each frame.

In an embodiment, the pixels PXL may include light emitting elements. For example, each pixel PXL may include a first light emitting unit (or light emitting part) including at least one first light emitting element, and a second light emitting part including at least one second light emitting element. In an embodiment, a luminance of each pixel PXL may correspond to the first data signal, and a ratio of a current flowing through the first light emitting part and the second light emitting part of each pixel PXL may correspond to the second data signal.

In an embodiment, each pixel PXL may include a light emitting element LD according to the embodiment of FIGS. 1 and 2, for example, a rod-shaped light emitting element LD having a small size of a range from the nanometer scale to micrometer scale. For example, each of the first light emitting part and the second light emitting part may include at least one rod-shaped light emitting element LD. Various types of light emitting elements may be used as a light source of the pixel PXL. For example, in another embodiment, the light source of the pixel PXL may be configured using an inorganic or organic light emitting element of different sizes or an inorganic light emitting element of a core-shell structure, or the like.

Each pixel PXL may have a structure according to at least one of the embodiments to be described below. For example, the pixels PXL may have a structure to which one of the embodiments to be described below is applied, or may have a structure to which at least two embodiments are applied in combination. The pixels PXL may be configured to be substantially equal or similar to each other.

In an embodiment, the pixels PXL may include pixels PXL of at least two colors. For example, the pixels PXL may include red pixels for emitting red light, green pixels for emitting green light, and blue pixels for emitting blue light.

In an embodiment, pixels PXL of different colors and data lines DL corresponding thereto may be disposed on each vertical line. The pixels PXL of different colors may include inorganic light emitting elements that emit light of different colors (for example, inorganic light emitting elements that emit light in a first color and a second color, respectively, as the light emitting elements LD according to the embodiments of FIGS. 1 and 2), to emit light of different colors. As another example, the pixels PXL of different colors may include inorganic light emitting elements that emit light of the same color (for example, inorganic light emitting elements that emit light in the same color (for example, blue) as the light emitting elements LD according to the embodiments of FIGS. 1 and 2), and the pixels PXL of at least one color may additionally include a separate configuration for color conversion. For example, the pixels PXL of different colors may be controlled to emit light of different colors by applying a light conversion layer including at least one type of wavelength conversion particles (for example, quantum dots) and/or a color filter of a specific color to the pixels PXL alone or in combination. The light conversion layer and/or the color filter may be a configuration that is separately provided and/or disposed inside the pixel PXL so as to be included in each pixel PXL or around each pixel PXL (for example, an upper region of the pixel PXL).

The display panel DPN may include a non-display area NA. Various lines, pads, and/or built-in circuit units (or parts) electrically connected to the pixels PXL of the display area DA may be disposed in the non-display area NA.

The scan driver SDR may receive a first control signal SCS from the timing controller TCON and supply scan signals to the scan lines SL in response to the first control signal SCS. The first control signal SCS may be a scan control signal. For example, the first control signal SCS may include a scan start signal (for example, a sampling pulse input to a first stage of the scan driver SDR) and at least one scan clock signal.

In an embodiment, the scan driver SDR may sequentially output the scan signals to the scan lines SL in response to the first control signal SCS. The pixels PXL selected by the scan signals may receive the first and second data signals of a corresponding frame from the data lines DL.

The data driver DDR may receive a second control signal DCS and image data IMD from the timing controller TCON and output the first and second data signals in response to the second control signal DCS and the image data IMD. The second control signal DCS may be a data control signal. For example, the second control signal DCS may include a source sampling pulse, a source sampling clock, a source output enable signal, and the like.

In an embodiment, the data driver DDR may output first data signals and second data signals of different voltages with respect to at least some grayscale values in response to the image data IMD of each frame. For example, the data driver DDR may output the first data signal and the second data signal of different voltages to the pixel PXL, in response to at least some grayscale values among grayscale values of each pixel PXL included in the image data IMD of each frame.

The first data signal may be a voltage or current signal corresponding to a luminance to be displayed in the corresponding pixel PXL during each frame period. For example, the first data signal may be a data voltage corresponding to a grayscale value of the image data IMD corresponding to the pixel PXL. The first data signal may be a data voltage corresponding to a gamma value of a luminance to be expressed or displayed in the corresponding pixel PXL.

The second data signal may be a signal different from the first data signal with respect to at least some grayscale values, as a data voltage corresponding to the grayscale value of the image data IMD corresponding to the corresponding pixel PXL during each frame period. For example, the second data signal may be a data voltage for adjusting a ratio of a current flowing through the first light emitting part and the second light emitting part of each pixel PXL in response to at least some grayscale values.

In an embodiment, the first data signals and the second data signals corresponding to the image data IMD of each frame may be generated using different gamma voltages Vgam. For example, the data driver DDR may generate the first data signals to be supplied to the pixels PXL during a corresponding frame period by using the image data IMD and a first gamma voltage Vgam1 of each frame. The data driver DDR may generate the second data signals to be supplied to the pixels PXL during a corresponding frame period by using the image data IMD and a second gamma voltage Vgam2 of each frame.

For example, the first data signal corresponding to each pixel PXL may be a first data voltage generated according to the grayscale value of the image data IMD corresponding to the pixel PXL, and the first gamma voltage Vgam1 corresponding to the grayscale value. The second data signal corresponding to each pixel PXL may be a second data voltage according to the grayscale value of the image data IMD corresponding to the pixel PXL, and the second gamma voltage Vgam2 corresponding to the grayscale value. In an embodiment, the first data voltage and the second data voltage corresponding to each grayscale value (or at least one grayscale value) may be different from each other.

In an embodiment, the data driver DDR may simultaneously output the first data signal and the second data signal corresponding to each of the pixels PXL to the data lines DL (for example, first and second data lines) electrically connected to the pixels PXL of a corresponding horizontal line during each horizontal period. As another example, the data driver DDR may sequentially output the first data signal and the second data signal corresponding to each of the pixels PXL to the data lines DL (for example, the first data lines) electrically connected to the pixels PXL of a corresponding horizontal line during each horizontal period.

The gamma voltage generator GMG may generate gamma voltages Vgam for converting an input image signal RGB of a digital form into the first and second data signals (for example, the first and second data voltages) of an analog form. For example, in case that the display device expresses 0 to 255 grayscales, the gamma voltage generator GMG may generate the first gamma voltage Vgam1 and the second gamma voltage Vgam2 corresponding to the grayscale values of the input image signal RGB so that the pixels PXL exhibit a characteristic corresponding to a predetermined target gamma value (or target gamma curve), for example, 2.2 gamma, and may supply the first gamma voltage Vgam1 and the second gamma voltage Vgam2 to the data driver DDR.

Each of the first gamma voltage Vgam1 and the second gamma voltage Vgam2 may include gamma voltages corresponding to reference grayscale values of the input image signal RGB. In an embodiment, the first gamma voltage Vgam1 and the second gamma voltage Vgam2 may be experimentally determined so that a luminance characteristic (or a gamma characteristic) finally expressed in each pixel PXL becomes the target gamma value (for example, 2.2 gamma).

In an embodiment, a driving current flowing through each pixel PXL may be determined by the first data signal. The first gamma voltage Vgam1 may include gamma voltages corresponding to the target gamma value (for example, 2.2 gamma) or a gamma value similar to the target gamma value.

In an embodiment, a ratio of the driving current supplied to the light emitting parts included in each pixel PXL may be determined by the second data signal, and the second gamma voltage Vgam2 may include gamma voltages for controlling the ratio of the driving current supplied to the light emitting parts of each pixel PXL to a desired value or form in response to the reference grayscale values of the input image signal RGB. For example, the second gamma voltage Vgam2 may be gamma voltages for controlling the driving current of each pixel PXL such that the driving current is supplied to the first light emitting part of the pixel PXL in response to at least one reference grayscale value belonging to a low grayscale range equal to or less than a first set value and controlling the driving current such that the driving current is divided and flowed to the first light emitting part and the second light emitting part of the pixel PXL in response to reference grayscale values belonging to a grayscale range equal to or greater than the first set value. In an embodiment, the second gamma voltage Vgam2 may gamma voltages for controlling the pixels PXL so that the ratio between the driving currents flowing through the second light emitting part of the pixel PXL is increased as each reference grayscale value is increased in response to the reference grayscale values belonging to a predetermined grayscale range equal to or greater than the first set value.

To this end, the gamma voltage generator GMG may store a first gamma value (or the first gamma voltage Vgam1) and a second gamma value (or the second gamma voltage Vgam2) set differently with respect to the pixels PXL of each color. For example, as shown in FIG. 4, the gamma voltage generator GMG may include a first lookup table LUT1 in which a first red gamma value GAMr1 (for example, first red grayscale voltages corresponding to grayscale values) corresponding to red pixels is stored, and a second lookup table LUT2 in which a second red gamma value GAMr2 (for example, second red grayscale voltages corresponding to the grayscale values) corresponding to the red pixels is stored. Similarly, the gamma voltage generator GMG may include a third lookup table LUT3 in which a first green gamma value GAMg1 (for example, first green grayscale voltages corresponding to the grayscale values) corresponding to green pixels is stored, a fourth lookup table LUT4 in which a second green gamma value GAMg2 (for example, second green grayscale voltages corresponding to the grayscale values) corresponding to the green pixels is stored, a fifth lookup table LUT5 in which a first blue gamma value GAMb1 (for example, first blue grayscale voltages corresponding to the grayscale values) corresponding to blue pixels is stored, and a sixth lookup table LUT6 in which a second blue gamma value GAMb2 (for example, second blue grayscale voltages corresponding to the grayscale values) corresponding to the blue pixels is stored.

The timing controller TCON may receive control signals CS and the input image signal RGB from an external device (for example, a host processor) and control an operation of the scan driver SDR and the data driver DDR in response to the control signals CS and the input image signal RGB. The control signals CS may include timing signals such as a vertical synchronization signal, a horizontal synchronization signal, and a main clock signal.

The timing controller TCON may generate the first control signal SCS and the second control signal DCS in response to the control signals CS. The first control signal SCS may be supplied to the scan driver SDR, and the second control signal DCS may be supplied to the data driver DDR.

The timing controller TCON may generate the image data IMD of each frame by using the input image signal RGB corresponding to an image to be displayed during each frame period, and supply the image data IMD to the data driver DDR. For example, the timing controller TCON may generate the image data IMD by converting a data format of the input image signal RGB according to an interface specification with the data driver DDR.

In the display device DD according to the above-described embodiment, each pixel PXL may be electrically connected to any one scan line SL and data lines DL. In this case, each vertical line may include the data lines DL, and the data driver DDR may simultaneously supply different data signals to the data lines DL at a time. For example, the data driver DDR may include a data signal generator and a buffer part including channels corresponding to the data lines DL, and may simultaneously supply the first and second data signals to the data lines DL so as to be synchronized with the scan signal for each horizontal period.

As another example, each pixel PXL may be electrically connected to scan lines SL and a data line DL. In this case, the scan driver SDR may sequentially supply the first scan signal and the second scan signal to each of the scan lines SL. The data driver DDR may sequentially supply the first data signal and the second data signal to any data line DL. For example, during a horizontal period corresponding to each horizontal line, the data driver DDR may output the first data signals corresponding to the pixels PXL of the corresponding horizontal line to the data lines DL so as to be synchronized with the first scan signal and output the second data signals corresponding to the pixels PXL of the corresponding horizontal line to the data lines DL so as to be synchronized with the second scan signal, simultaneously.

In an embodiment, the first data signal may be a data voltage corresponding to a luminance characteristic to be expressed by the pixels PXL. The second data signal may be a data voltage generated as a voltage different from a voltage of the first data signal in response to at least one grayscale value, as a data voltage for controlling the ratio of the driving current divided and flowed to the first light emitting part and the second light emitting part of the corresponding pixel PXL in response to the grayscale value of the image data IMD corresponding to the pixel PXL during each frame period.

In an embodiment, the second data signal may correspond to a data voltage capable of controlling the pixel PXL so that the driving current of the pixel PXL intensively flows to the first light emitting part in the low grayscale equal to or less than (or less than) the predetermined reference grayscale value and controlling the pixel PXL so that the driving current of the pixel PXL is divided and flowed to the first light emitting part and the second light emitting part in the grayscale greater than (or equal to or greater than) the reference grayscale value. The second data signal may correspond to a data voltage capable of increasing the ratio of the divided current flowing through the second light emitting part so that a relatively large current flows through the second light emitting part as the grayscale value increases with respect to the grayscale value greater than (or equal to or greater than) the reference grayscale value.

Figure 5:
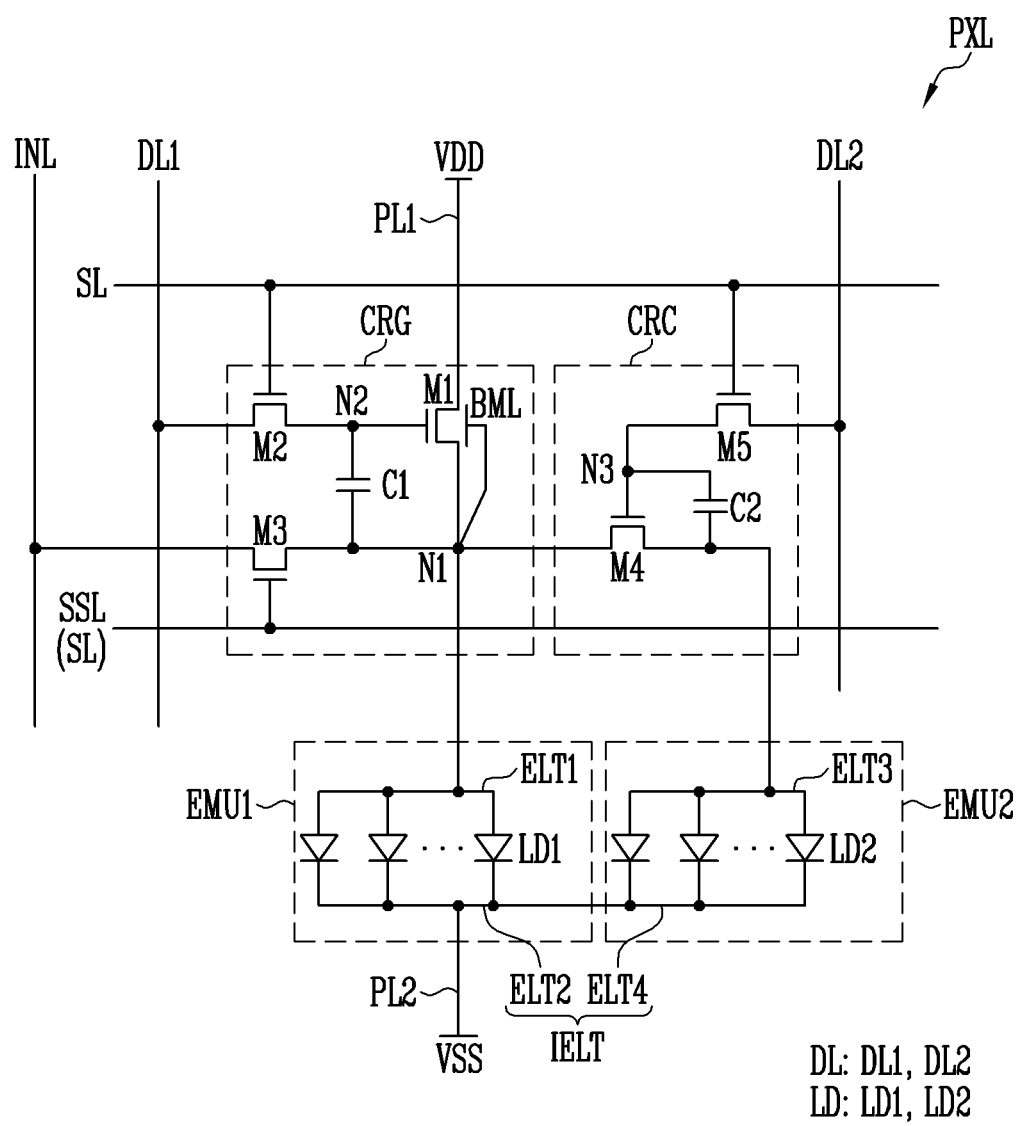
FIGS. 5 to 7 are circuit diagrams each schematically illustrating a pixel according to an embodiment of the disclosure.
Figure 6:
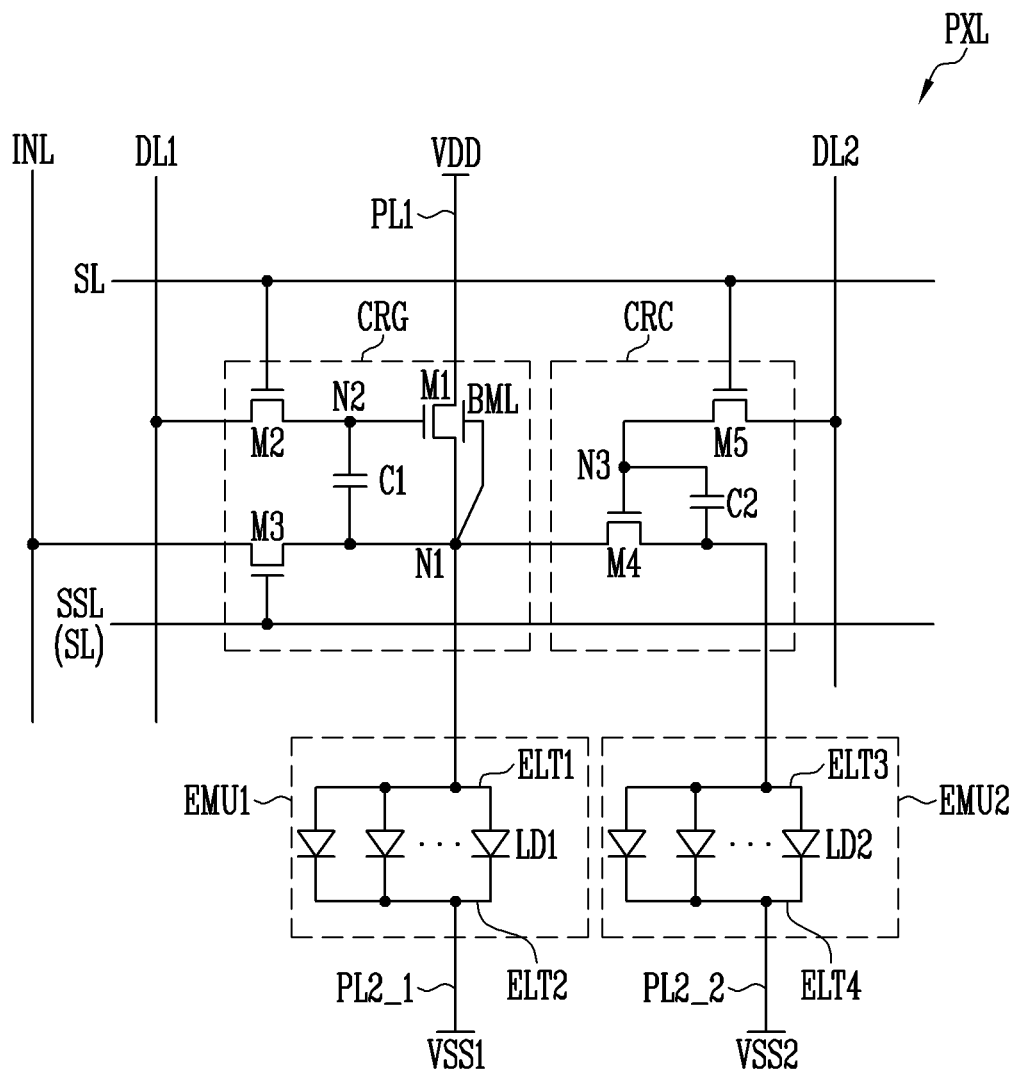
Figure 7:
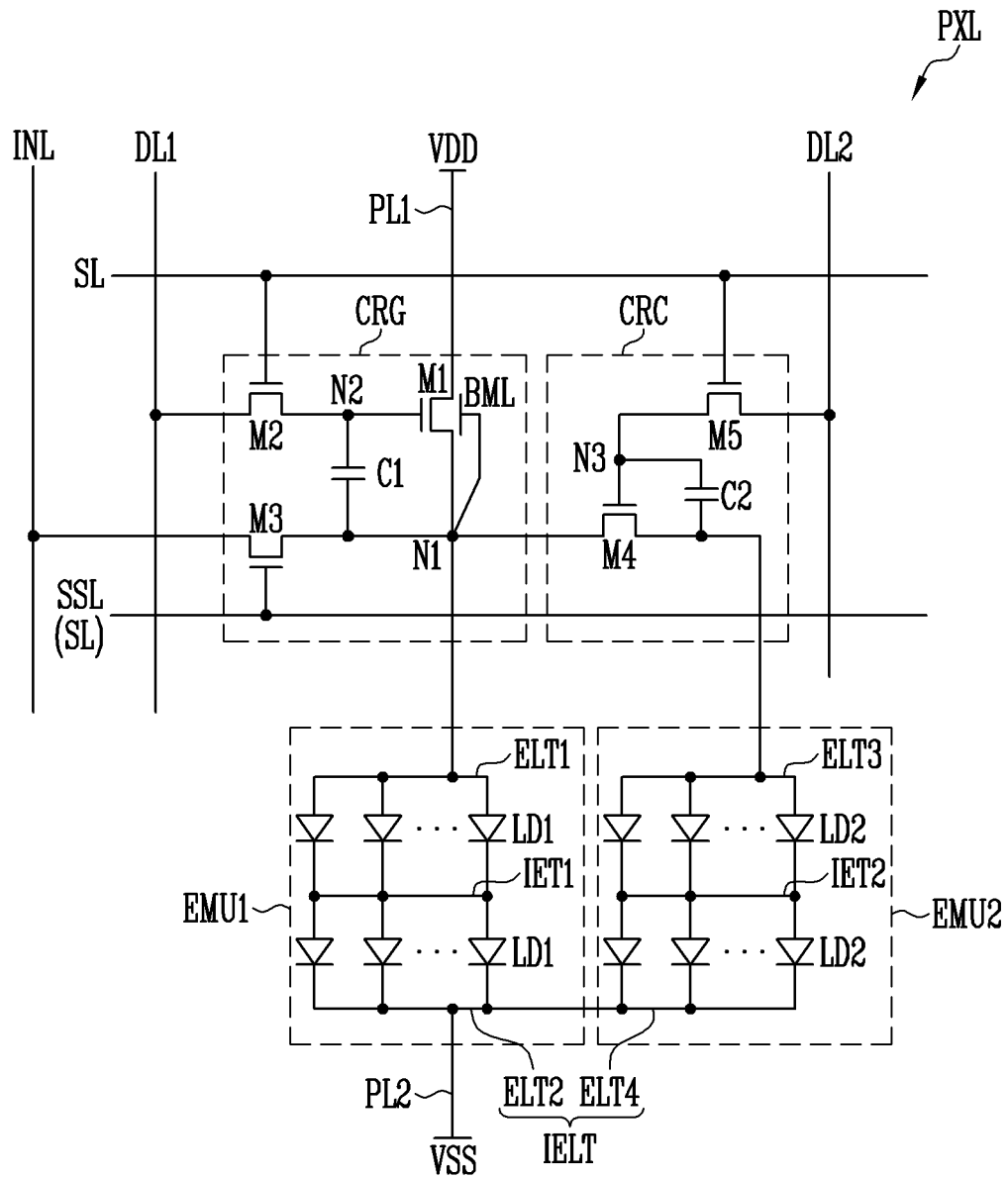

FIGS. 5 to 7 are circuit diagrams each schematically illustrating a pixel PXL according to an embodiment. Compared with FIG. 5, FIG. 6 illustrates another embodiment of the pixel PXL related to a second power source VSS. Compared with FIG. 5, FIG. 7 illustrates another embodiment of the pixel PXL related to a structure of a first light emitting part EMU1 and a second light emitting part EMU2.

According to an embodiment, each pixel PXL shown in FIGS. 5 to 7 may be any of the pixels PXL provided in the display area DA of FIG. 3. The pixels PXL disposed in the display area DA may have substantially the same or similar structure to each other.

Referring to FIGS. 5 to 7, the pixel PXL may be electrically connected to the scan line SL, a first data line DL1, a second data line DL2, a first power line PL1, and a second power line PL2. The pixel PXL may be selectively further electrically connected to at least one other power and/or signal line. For example, the pixel PXL may be further electrically connected to an initialization power line INL (or a sensing line) and/or a control line SSL.

The pixel PXL may include a first light emitting part EMU1 and a second light emitting part EMU2 electrically connected between a first power source VDD and the second power source VSS, and each including at least one light emitting element LD. The pixel PXL may include a current generator CRG electrically connected between the first power source VDD and the first light emitting part EMU1 and between the first power source VDD and the second light emitting part EMU2 and driven by the scan signal and the first data signal, and a current controller CRC electrically connected between the current generator CRG and the second light emitting part EMU2 and driven by the scan signal and the second data signal.

The current generator CRG may be electrically connected between the first power source VDD and a first node N1 and may generate the driving current corresponding to the first data signal. To this end, the current generator CRG may be electrically connected to the scan line SL to which the first scan signal is supplied, the first data line DL1 to which the first data signal is supplied, and the first power line PL1 to which a voltage or power of the first power source VDD is supplied.

The current generator CRG may be selectively further electrically connected to the control line SSL to which a predetermined control signal is supplied, and initialization power (or reference power) or the initialization power line INL electrically connected to a sensing circuit in correspondence with a display period or a sensing period. In an embodiment, the control signal may be the same as or different from the first scan signal. In case that the control signal is the same signal as the first scan signal, the control line SSL may be integrated with (or integral with) the scan line SL.

The current generator CRG may also be electrically connected to the first light emitting part EMU1 and the second light emitting part EMU2. For example, the current generator CRG may be electrically connected to a first electrode ELT1 of the first light emitting part EMU1 and a third electrode ELT3 of the second light emitting part EMU2.

The current generator CRG may include at least one transistor and a capacitor. For example, the current generator CRG may include a first transistor M1, a second transistor M2, a third transistor M3, and a first capacitor C1.

The first transistor M1 may be electrically connected between the first power source VDD and the first node N1, and a gate electrode of the first transistor M1 may be electrically connected to a second node N2. The first transistor M1 may generate the driving current of the pixel PXL in response to a voltage of the second node N2. For example, the first transistor M1 may be a driving transistor that generates the driving current corresponding to the first data signal supplied to the second node N2 during each frame period.

In an embodiment, the first transistor M1 may further include a bottom metal layer BML (also referred to as a "second gate electrode" or a "back gate electrode"). In an embodiment, the bottom metal layer BML may be electrically connected to an electrode (for example, a source electrode electrically connected to the first node N1) of the first transistor M1.

In an embodiment in which the first transistor M1 includes the bottom metal layer BML, a back-biasing technique (or sync technique) for moving a threshold voltage of the first transistor M1 in a negative direction or a positive direction by applying a back-biasing voltage to the bottom metal layer BML of the first transistor M1 may be applied. In case that the bottom metal layer BML is disposed so as to overlap a semiconductor pattern configuring a channel of the first transistor M1, an operation characteristic of the first transistor M1 may be stabilized by blocking light incident on the semiconductor pattern.

The second transistor M2 may be electrically connected between the first data line DL1 and the second node N2, and a gate electrode of the second transistor M2 may be electrically connected to the scan line SL. The second transistor M2 may be turned on by the first scan signal. For example, the second transistor M2 may be turned in case that the first scan signal of a gate-on voltage (for example, a high-level voltage) is supplied from the scan line SL, to electrically connect the first data line DL and the second node N2.

For each frame period, the data signal of a corresponding frame may be supplied to the first data line DL, and the first data signal may be transmitted to the second node N2 through the second transistor M2 during a period in which the first scan signal of the gate-on voltage is supplied. For example, the second transistor M2 may be a first switching transistor for transmitting the first data signal of each frame into the subpixel.

The third transistor M3 may be electrically connected between the first node N1 and the initialization power line INL, and a gate electrode of the third transistor M3 may be electrically connected to the control line SSL (or the scan line SL). The third transistor M3 may be turned on by the control signal. For example, the third transistor M3 may be turned on in case that the control signal of a gate-on voltage (for example, a high-level voltage) is supplied from the control line SSL, to transmit a voltage (or a reference voltage) of the initialization power supplied to the initialization power line INL to the first node N1.

During the sensing period for sensing a characteristic of the pixel PXL, the third transistor M3 may be turned on by the control signal supplied from the control line SSL, to transmit a voltage of the first node N1 to the initialization power line INL. The voltage of the first node N1 transmitted to the initialization power line INL may be provided to the driving circuit such as a timing controller through the sensing circuit, and may be used to compensate for a characteristic deviation of the pixels PXL.

In case that the control line SSL is integrated into the scan line SL, the third transistor M3 may be turned on in case that the first scan signal of the gate-on voltage (for example, the high-level voltage) is supplied from the scan line SL. In case that the third transistor M3 is turned on, the voltage of the initialization power supplied to the initialization power line INL may be transmitted to the first node N1, or the voltage of the first node N1 may be transmitted to the initialization power line INL.

The first capacitor C1 may be electrically connected between the first node N1 and the second node N2. The first capacitor C1 may be charged with a voltage corresponding to the first data signal supplied to the second node N2 during each frame period. Accordingly, during an emission period of the pixel PXL, the first transistor M1 may be turned on to a degree corresponding to the first data signal.

The current controller CRC may be electrically connected between the first node N1 and the second light emitting part EMU2 and may adjust a divided current supplied to the second light emitting part EMU2 in response to the second data signal. The divided current may be a current corresponding to at least a portion of the driving current generated by the current generator CRG and may be a current supplied to the second light emitting part EMU2 among the driving currents.

The current controller CRC may include at least one transistor and a capacitor. For example, the current controller CRC may include a fourth transistor M4, a fifth transistor M5, and a second capacitor C2.

The fourth transistor M4 may be electrically connected between the first node N1 and the second light emitting part EMU2, and a gate electrode of the fourth transistor M4 may be electrically connected to a third node N3. The fourth transistor M4 may adjust the divided current supplied to the second light emitting part EMU2 in response to a voltage of the third node N3. For example, the fourth transistor M4 may be a sub driving transistor that adjusts the ratio of the driving current supplied to the second light emitting part EMU2 in response to the second data signal supplied to the third node N3 during each frame period. For example, the fourth transistor M4 may be turned on to a level corresponding to a voltage of the second data signal to adjust the divided current supplied to the second light emitting part EMU2.

In an embodiment, the second data signal corresponding to a first reference grayscale value (for example, a low grayscale reference value) or less may be a data voltage of an amplitude or a level that substantially turns off the fourth transistor M4. Accordingly, in case that the second data signal corresponding to the first reference grayscale value or less is supplied, the driving current of the pixel PXL may be intensively supplied to the first light emitting part EMU1. In this case, a current may not flow or only a minute current may flow through the second light emitting part EMU2.

In an embodiment, the second data signal corresponding to the first reference grayscale value or more may be a data voltage (for example, a data voltage that allows a larger current to flow) having a larger amplitude or level as the grayscale value increases. Accordingly, in case that the second data signal corresponding to the first reference grayscale value or more is supplied, as the grayscale value increases, the divided current, which occupies a larger proportion of the driving current of the pixel PXL, may flow through the second light emitting part EMU2.

In an embodiment, the second data signal corresponding to a predetermined second reference grayscale value (for example, a high grayscale reference value) or more may be a data voltage capable of completely turning on the fourth transistor M4. Accordingly, in case that the second data signal corresponding to the second reference grayscale value or more is supplied, the driving current of the pixel PXL may be more concentrated to the second light emitting part EMU2.

In an embodiment, a relative size and/or characteristic of the first transistor M1 and the fourth transistor M4 may be adjusted so that the divided current supplied to the second light emitting part EMU2 may be easily adjusted by the second data signal. In an embodiment, a size (for example, a ratio (W/L) of a width and a length of a channel of the first transistor M1) of the first transistor M1 may be formed to be larger than a size (for example, a ratio (W/L) of a width and a length of a channel of the fourth transistor M4) of the fourth transistor M4. The voltage of the second data signal (or the second gamma voltage Vgam2) may be adjusted in consideration of a difference of the sizes and/or characteristics of the first transistor M1 and the fourth transistor M4.

The fifth transistor M5 may be electrically connected between the second data line DL2 and the third node N3, and a gate electrode of the fifth transistor M5 may be electrically connected to the scan line SL. The fifth transistor M5 may be turned on by the first scan signal. For example, the fifth transistor M5 may be turned on in case that the first scan signal of the gate-on voltage is supplied from the scan line SL, to electrically connect the second data line DL2 to the third node N3.

For each frame period, the second data signal of a corresponding frame may be supplied to the second data line DL2, and the second data signal may be supplied to the third node N3 through the fifth transistor M5 during a period in which the first scan signal of the gate-on voltage is supplied. For example, the fifth transistor M5 may be a second switching transistor for transmitting the second data signal of each frame to the pixel PXL.

The second capacitor C2 may be electrically connected between an electrode of the fourth transistor M4 and the third node N3. For example, the second capacitor C2 may be electrically connected between a source electrode of the fourth transistor M4 and the third node N3. The second capacitor C2 may be charged with a voltage corresponding to the second data signal supplied to the third node N3 during each frame period. Accordingly, during the emission period of the pixel PXL, the fourth transistor M4 may be turned on to a degree corresponding to the second data signal.

FIGS. 5 and 6 illustrate that transistors included in the pixel PXL are N-type transistors, but the disclosure is not limited thereto. For example, at least one of the first to fifth transistors M1 to M5 may be changed to a P-type transistor.

The first light emitting part EMU1 and the second light emitting part EMU2 may be electrically connected in parallel between the current generator CRG and the second power source VSS. However, the current controller CRC may be electrically connected between the current generator CRG and the second light emitting part EMU2. The first light emitting part EMU1 and the second light emitting part EMU2 may emit light with a luminance corresponding to the driving current supplied through the current generator CRG.

In the embodiment of FIG. 5, the first light emitting part EMU1 and the second light emitting part EMU2 may be electrically connected to a same second power source VSS through a second power line PL2. The second power source VSS may be a low-potential pixel power source having a potential lower than that of the first power source VDD, and the first power source VDD may be a high-potential pixel power source. During the emission period of the pixel PXL, a potential difference between the first power source VDD and the second power source VSS may be equal to or greater than a threshold voltage of each of the first and second light emitting elements LD1 and LD2.

As in the embodiment of FIG. 5, in case that the first light emitting part EMU1 and the second light emitting part EMU2 are electrically connected to the same second power source VSS through a second power line PL2, a second electrode ELT2 and a fourth electrode ELT4 may be electrically connected and/or formed integrally or non-integrally. In this case, the second electrode ELT2 and the fourth electrode ELT4 may form an integrated electrode IELT.

In the embodiment of FIG. 6, the second power source VSS may include sub-power sources (for example, a first sub-power source VSS1 and a second sub-power source VSS2) having different potentials, and the first light emitting part EMU1 and the second light emitting part EMU2 may be electrically connected to different sub-power sources through different second power lines (for example, a first sub-power line PL2_1 and a second sub-power line PL2_2). In this case, the second electrode ELT2 and the fourth electrode ELT4 may be separated from each other.

For example, the first light emitting part EMU1 may be electrically connected to the first sub-power source VSS1 through the first sub-power line PL2_1, and the second light emitting part EMU2 may be electrically connected to the second sub-power source VSS2 through the second sub-power line PL2_2. The first sub-power source VSS1 may supply a voltage or power of the second power source VSS of a first potential, and the second sub-power source VSS2 may supply a voltage or power of the second power source VSS of a second potential. In an embodiment, the second potential may be lower than the first potential. In this case, during a period in which the driving current is divided and flowed to the first light emitting part EMU1 and the second light emitting part EMU2 by the current generator CRG and the current controller CRC, it is possible to induce more current to flow through the second light emitting part EMU2.

In the embodiments of FIGS. 5 and 6, each of the first light emitting part EMU1 and the second light emitting part EMU2 may be configured as light emitting part of a parallel structure, but the disclosure is not limited thereto. For example, at least one of the first light emitting part EMU1 and the second light emitting part EMU2 may be configured in a series-parallel structure as in the embodiment of FIG. 7.

The first light emitting part EMU1 may include at least one first light emitting element LD1 electrically connected between the current generator CRG and the second power source VSS, and the first electrode ELT1 and the second electrode ELT2 electrically connected to the first light emitting element LD1. For example, the first light emitting part EMU1 may include the first electrode ELT1 electrically connected to the first node N1, the second electrode ELT2 electrically connected to the second power source VSS (or the first sub-power source VSS1) through the second power line PL2 (or the first sub-power line PL2_1), and at least one light emitting element LD1 electrically connected in a forward direction between the first electrode ELT1 and the second electrode ELT2. The at least one first light emitting element LD1 may configure a light source of the first light emitting part EMU1 and may emit light with a luminance corresponding to the driving current (for example, the divided current) supplied to the first light emitting part EMU1.

In an embodiment, the first light emitting part EMU1 may include first light emitting elements LD1 electrically connected in parallel between the first electrode ELT1 and the second electrode ELT2, but the disclosure is not limited thereto. For example, the first light emitting part EMU1 may include first light emitting elements LD1 electrically connected only in series between the first electrode ELT1 and the second electrode ELT2, or may include only a single first light emitting element LD1 electrically connected between the first electrode ELT1 and the second electrode ELT2.

As another example, the first light emitting part EMU1 may include first light emitting elements LD1 electrically connected in series-parallel between the first electrode ELT1 and the second electrode ELT2. For example, as shown in FIG. 7, the first light emitting part EMU1 may be configured in a series-parallel mixed structure including first light emitting elements LD1 arranged in at least two serial stages. In this case, the first light emitting part EMU1 may further include at least one first intermediate electrode IET1 electrically connecting the two successive serial stages.

The second light emitting part EMU2 may include at least one second light emitting element LD2 electrically connected between the current generator CRG and the second power source VSS, and a third electrode ELT3 and a fourth electrode ELT4 electrically connected to the second light emitting element LD2. For example, the second light emitting part EMU2 may include the third electrode ELT3 separated from the first electrode ELT1 and electrically connected to the first node N1 through the current controller CRC (for example, the fourth transistor M4), the fourth electrode ELT4 electrically connected to the second power source VSS (or the second sub-power source VSS2) through the second power line PL2 (or the second sub-power line PL2_2), and at least one second light emitting element LD2 electrically connected in a forward direction between the third electrode ELT3 and the fourth electrode ELT4. The at least one second light emitting element LD2 may configure a light source of the second light emitting part EMU2 and may emit light with a luminance corresponding to the driving current (for example, the divided current) supplied to the second light emitting part EMU2.

In an embodiment, the second light emitting part EMU2 may include second light emitting elements LD2 electrically connected in parallel between the third electrode ELT3 and the fourth electrode ELT4, but the disclosure is not limited thereto. For example, the second light emitting part EMU2 may include second light emitting elements LD2 electrically connected only in series between the third electrode ELT3 and the fourth electrode ELT4, or may include only a single second light emitting element LD2 electrically connected between the third electrode ELT3 and the fourth electrode ELT4.

As another example, the second light emitting part EMU2 may include second light emitting elements LD2 electrically connected in series-parallel between the third electrode ELT3 and the fourth electrode ELT4. For example, as shown in FIG. 7, the second light emitting part EMU2 may be configured in a series-parallel mixed structure including the second light emitting elements LD2 arranged in at least two serial stages. In this case, the second light emitting part EMU2 may further include at least one second intermediate electrode IET2 electrically connecting the two successive serial stages.

Figure 8:
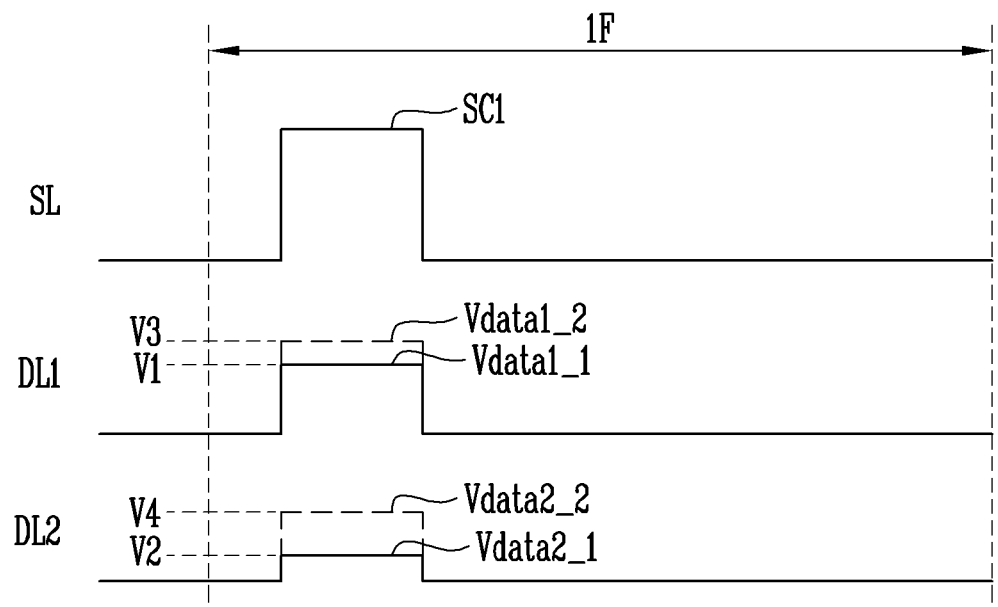
FIG. 8 is a waveform diagram schematically illustrating driving signals of the pixel according to an embodiment of the disclosure.

FIG. 8 is a schematic waveform diagram illustrating driving signals of the pixel PXL according to an embodiment. For example, FIG. 8 illustrates the first scan signal SC1, the first data signal Vdata1, and the second data signal Vdata2 that may be supplied to the pixels PXL according to the embodiments of FIGS. 5 to 7.

Referring to FIGS. 3 to 8, during a frame period 1F, the scan driver SDR may supply the first scan signal SC1 of the gate-on voltage to each scan line SL in a horizontal line unit. During a frame period 1F, the data driver DDR may supply the first data signal Vdata1 and the second data signal Vdata2 corresponding to the pixels PXL of a corresponding horizontal line to the data lines DL so as to be synchronized with a horizontal period corresponding to each horizontal line (for example, so as to be synchronized with each first scan signal SC1).

Each first data signal Vdata1 may be supplied to the first data line DL1 electrically connected to the pixel PXL corresponding thereto, and each second data signal Vdata2 may be supplied to the second data line DL2 electrically connected to the pixel PXL corresponding thereto. For example, during a period in which each first scan signal SC1 is supplied, the first and second data signals Vdata1 and Vdata2 may be simultaneously supplied to the pixels PXL disposed on the corresponding horizontal line through the first and second data lines DL1 and DL2.

For example, in case that the first scan signal SC1 having the gate-on voltage is supplied to each scan line SL, the second transistor M2 and the fifth transistor M5 of the pixel PXL (for example, pixels PXL arranged on the corresponding horizontal line) electrically connected to the scan line SL may be turned on. Accordingly, the first data signal Vdata1 supplied to the first data line DL1 of the pixel PXL may be supplied to the second node N2. The second data signal Vdata2 supplied to the second data line DL2 of the pixel PXL may be supplied to the third node N3.

During the period in which the first scan signal SC1 having the gate-on voltage is supplied to each scan line SL, the control signal SSL (or the first scan signal SC1) of the gate-on voltage may be supplied to the control line SSL (or the scan line SL). Accordingly, the third transistor M3 of the pixel PXL (for example, the pixels PXL arranged on the corresponding horizontal line) electrically connected to the control line SSL may be turned on.

Accordingly, a voltage corresponding to the first data signal Vdata1 may be stored in the first capacitor C1. A voltage corresponding to the second data signal Vdata2 may be stored in the second capacitor C2.

Subsequent to the data programming period according to the supply of the first scan signal SC1 and the first and second data signals Vdata1 and Vdata2, the emission period of the pixel PXL may be followed. During the emission period, the pixel PXL may emit light in response to the first and second data signals Vdata1 and Vdata2.

In an embodiment, the data driver DDR may vary a voltage of the first data signal Vdata1 and a voltage of the second data signal Vdata2 to be supplied to the pixel PXL according to the grayscale value of the image data IMD corresponding to each pixel PXL. For example, in case that the image data IMD corresponding to each pixel PXL has a first grayscale value, the data driver DDR may generate a first data signal Vdata1_1 of a first voltage V1 and a second data signal Vdata2_1 of a second voltage V2. In case that the image data IMD corresponding to each pixel PXL has a second grayscale value greater than the first grayscale value, the data driver DDR may generate a first data signal Vdata1_2 of a third voltage V3 and a second data signal Vdata2_2 of a fourth voltage V4. An amplitude or a level of the third voltage V3 may be greater than an amplitude or a level of the first voltage V1, and an amplitude or a level of the fourth voltage V4 may be greater than an amplitude or a level of the second voltage V2.

For example, the data driver DDR may generate the first data signal Vdata1 with an amplitude or a level corresponding to a target gamma value to be finally expressed in each pixel PXL according to the grayscale value of the image data IMD. Accordingly, during each emission period, the driving current corresponding to the first data signal Vdata1 may flow through the pixel PXL.

The data driver DDR may generate the second data signal Vdata2 to adjust the ratio of the driving current flowing through the first and second light emitting parts EMU1 and EMU2 according to the grayscale value of the image data IMD.

For example, in case that the grayscale value of the image data IMD corresponding to each pixel PXL is equal to or less than the first reference grayscale value, the data driver DDR may generate the second data signal Vdata2 as an off-voltage (for example, a voltage of an amplitude or a level capable of substantially turning off or weakly turning on the fourth transistor M4) of the fourth transistor M4. For example, in case that the grayscale value of the image data IMD corresponding to the pixel PXL is equal to or less than the first reference grayscale value, the voltage (for example, the second voltage V2) of the second data signal Vdata2 corresponding to the grayscale value of the image data IMD may be set to a level capable of turning off the fourth transistor M4. Accordingly, in case that the second data signal Vdata2 corresponding to the first reference grayscale value or less is supplied, the driving current of the pixel PXL may be concentrated to the first light emitting part EMU1. In this case, the driving current may not flow or only a minute current may flow through the second light emitting part EMU2. In an embodiment, the grayscale value equal to or less than the first reference grayscale value may be a grayscale value of a range in which a driving current equal to or less than a predetermined first reference current is generated in the pixel PXL.

In case that the current flowing through the second light emitting part EMU2 is blocked and the driving current is intensively supplied to the first light emitting part EMU1 in the low grayscale range in which a relatively small amount of driving current flows through the pixel PXL, a current flowing through each first light emitting element LD1 may increase. Accordingly, in case that the pixel PXL is driven in a low grayscale, a reduction of light emission efficiency and a color shift that may occur due to a decrease of a density of the current flowing through each light emitting element LD may be prevented or reduced. Accordingly, a low grayscale express ability of the pixel PXL may be increased.

In case that the image data IMD corresponding to each pixel PXL has a grayscale value of a range greater than the first reference grayscale value, the data driver DDR may generate the second data signal Vdata2 so that the amplitude or the level increases as the grayscale value increases. Accordingly, in case that the second data signal Vdata2 corresponding to the first reference grayscale value or more is supplied, as the grayscale value increases, the divided current occupying a larger proportion of the driving current of the pixel PXL may flow through the second light emitting part EMU2. In an embodiment, the second data signal Vdata2 corresponding to the second reference grayscale value or more may be a data voltage capable of completely turning on the fourth transistor M4. Accordingly, the driving current of the pixel PXL may be more concentrated to the second light emitting part EMU2. In an embodiment, a voltage of the second power source VSS applied to the second light emitting part EMU2 may be lowered than a voltage of the second power source VSS applied to the first light emitting part EMU1, to induce a larger current to flow through the second light emitting part EMU2.

In a high grayscale range (or some grayscale ranges in the grayscale range equal to or greater than the first reference grayscale value) in which a relatively large driving current flows through the pixel PXL, in case that a larger current is controlled to flow through the second light emitting part EMU2 compared with the first light emitting part EMU1, stress due to continuous light emission of the first light emitting elements LD1 may be relieved, and deterioration deviation of the first and second light emitting elements LD1 and LD2 may be reduced. Accordingly, deterioration of the pixel PXL may be improved, and image quality of the display device DD may be improved.

Figure 9:
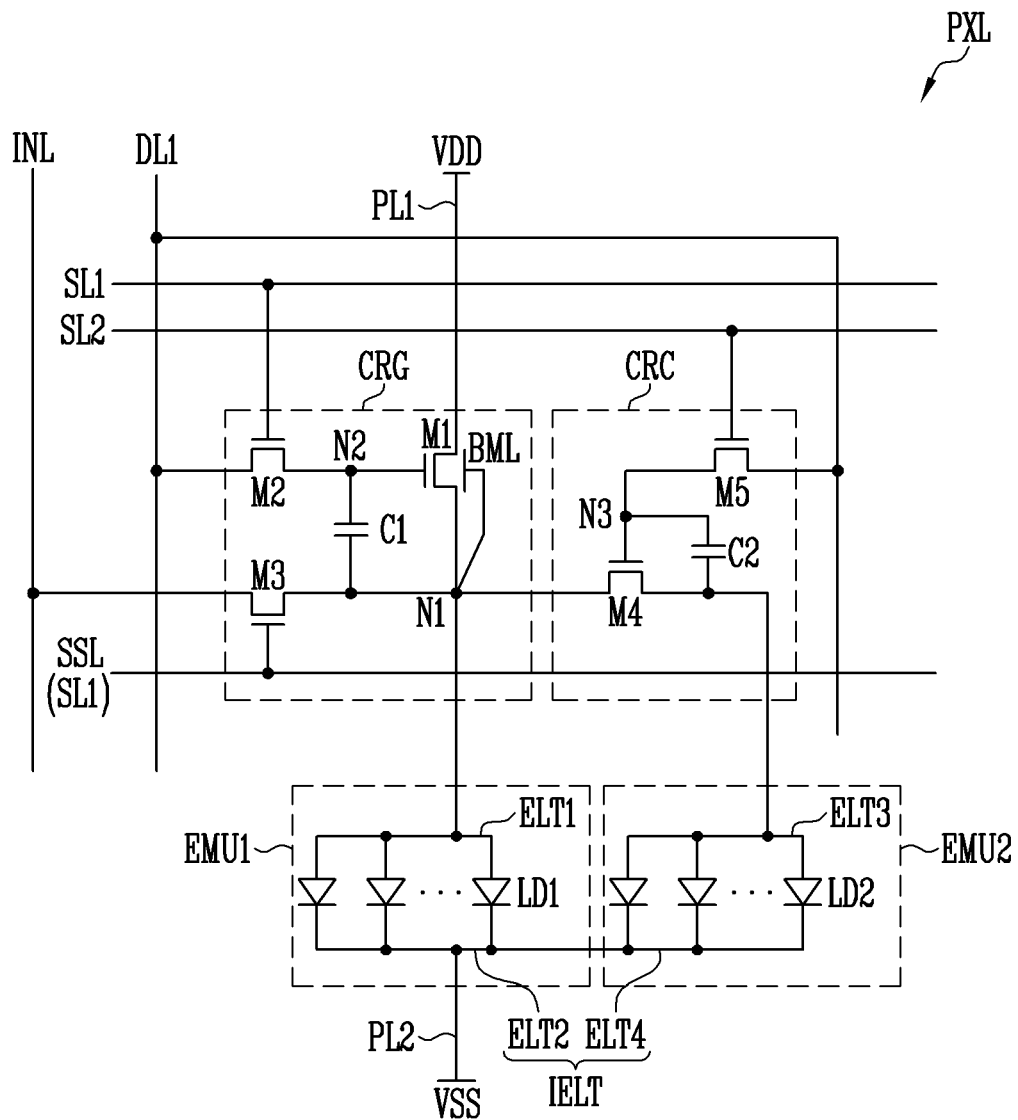
FIGS. 9 and 10 are circuit diagrams each schematically illustrating a pixel according to an embodiment of the disclosure.
Figure 10:
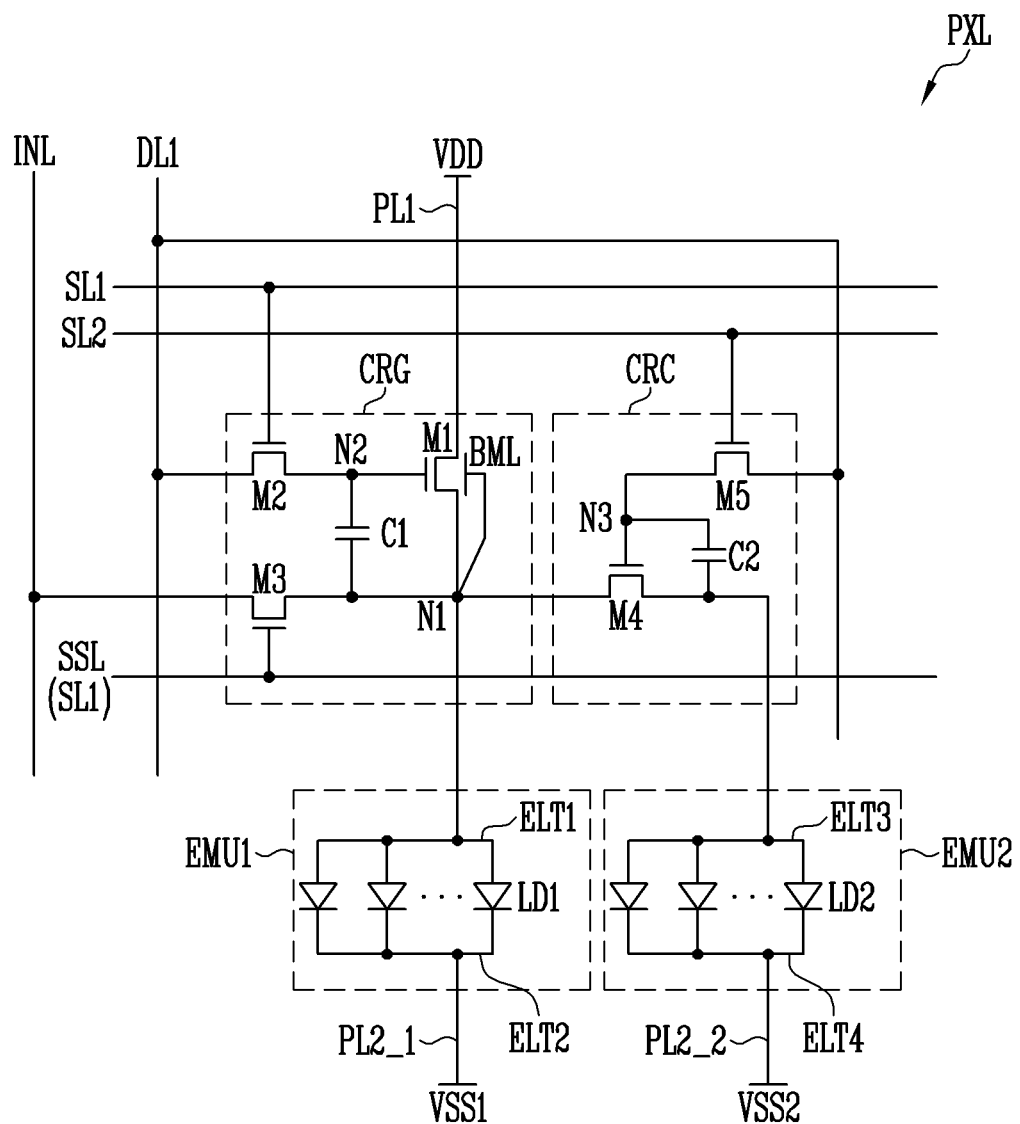

FIGS. 9 and 10 are circuit diagrams each schematically illustrating a pixel PXL according to an embodiment. For example, FIG. 9 illustrates a modified embodiment of the pixel PXL according to the embodiment of FIG. 5, and FIG. 10 illustrates a modified embodiment of the pixel PXL according to the embodiment of FIG. 6.

Figure 11:
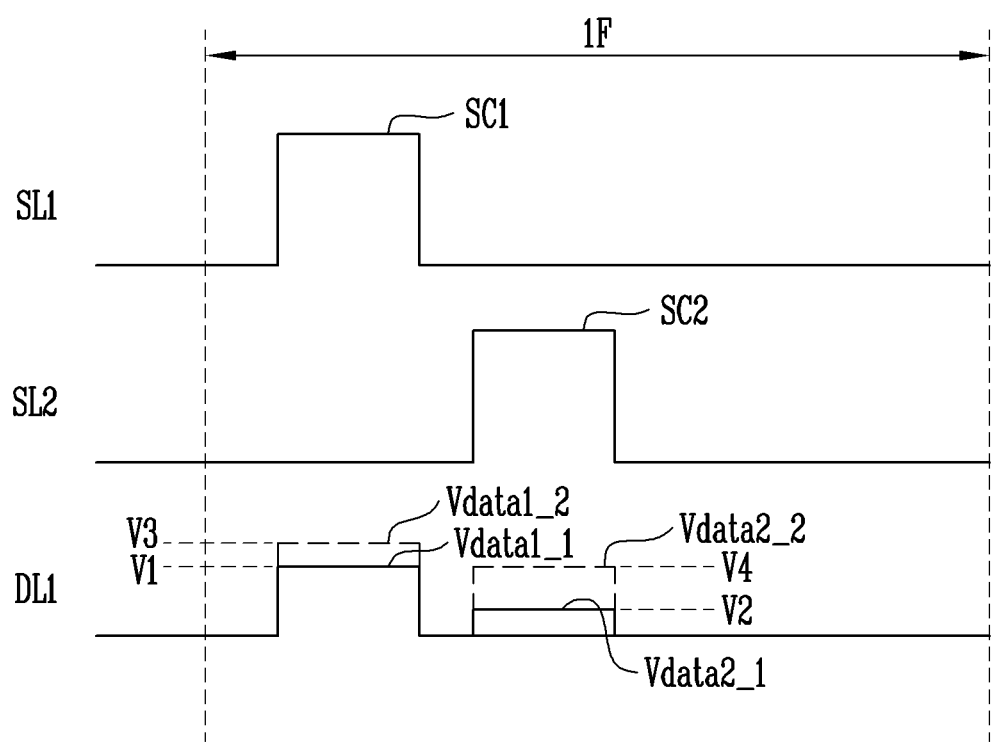
FIG. 11 is a waveform diagram schematically illustrating the driving signals of the pixel according to an embodiment of the disclosure.

FIG. 11 is a schematic waveform diagram illustrating the driving signals of the pixel PXL according to an embodiment. For example, FIG. 11 illustrates an example of the first scan signal SC1, a second scan signal SC2, the first data signal Vdata1, and the second data signal Vdata2 that may be supplied to the pixels PXL according to the embodiments of FIGS. 9 and 10. In the embodiments of FIGS. 9 to 11, the same reference numerals are assigned to configurations similar or identical to those of the above-described embodiments, and a detailed description thereof is omitted.

Referring to FIGS. 9 to 11 together with FIGS. 3 to 8, the current generator CRG and the current controller CRC of the pixel PXL may share a data line DL, for example, the first data line DL1. In this case, the display device DD may not include the second data line DL2 shown in FIGS. 5 to 7.

Each pixel PXL may be electrically connected to scan lines SL including a first scan line SL1 and a second scan line SL2. For example, the scan lines SL may be disposed for each horizontal line in the display area DA of FIG. 3.

The second transistor M2 may be electrically connected between the first data line DL1 and the second node N2, and a gate electrode of the second transistor M2 may be electrically connected to the first scan line SL1. The second transistor M2 may be turned on by the first scan signal SC1 of the gate-on voltage supplied to the first scan line SL1.

The fifth transistor M5 may be electrically connected between the first data line DL1 and the third node N3, and a gate electrode of the fifth transistor M5 may be electrically connected to the second scan line SL2. The fifth transistor M5 may be turned on by the second scan signal SC2 of the gate-on voltage supplied to the second scan line SL2.

The scan driver SDR may supply the first scan signal SC1 and the second scan signal SC2 to the first scan line SL1 and the second scan line SL2, respectively, and may supply the first scan signal SC1 and the second scan signal SC2 at different time points. For example, the scan driver SDR may sequentially output the first scan signal SC1 and the second scan signal SC2 to the first scan line SL1 and the second scan line SL2 of the corresponding horizontal line during each horizontal period.

The data driver DDR may sequentially output the first data signal Vdata1 and the second data signal Vdata2 to each first data line DL1. For example, the data driver DDR may supply the first data signal Vdata1 to each first data line DL1 to be synchronized with the first scan signal SC1, and may supply the second data signal Vdata2 to each first data line DL1 to be synchronized with the second scan signal SC2.

Accordingly, during the data programming period including a period in which the first scan signal SC1 is supplied and a period in which the second scan signal SC2 is supplied, the voltage corresponding to the first data signal Vdata1 may be stored in the first capacitor C1, and the voltage corresponding to the second data signal Vdata2 may be stored in the second capacitor C2.

An operation process of the pixel PXL according to the embodiments of FIGS. 9 and 10 may be substantially identical or similar to an operation process of the pixel PXL according to the embodiments of FIGS. 5 and 6, except that the first data signal Vdata1 and the second data signal Vdata2 are sequentially supplied to the pixel PXL in response to the first scan signal SC1 and the second scan signal SC2, respectively. Therefore, a detailed description thereof is omitted.

Figure 12:
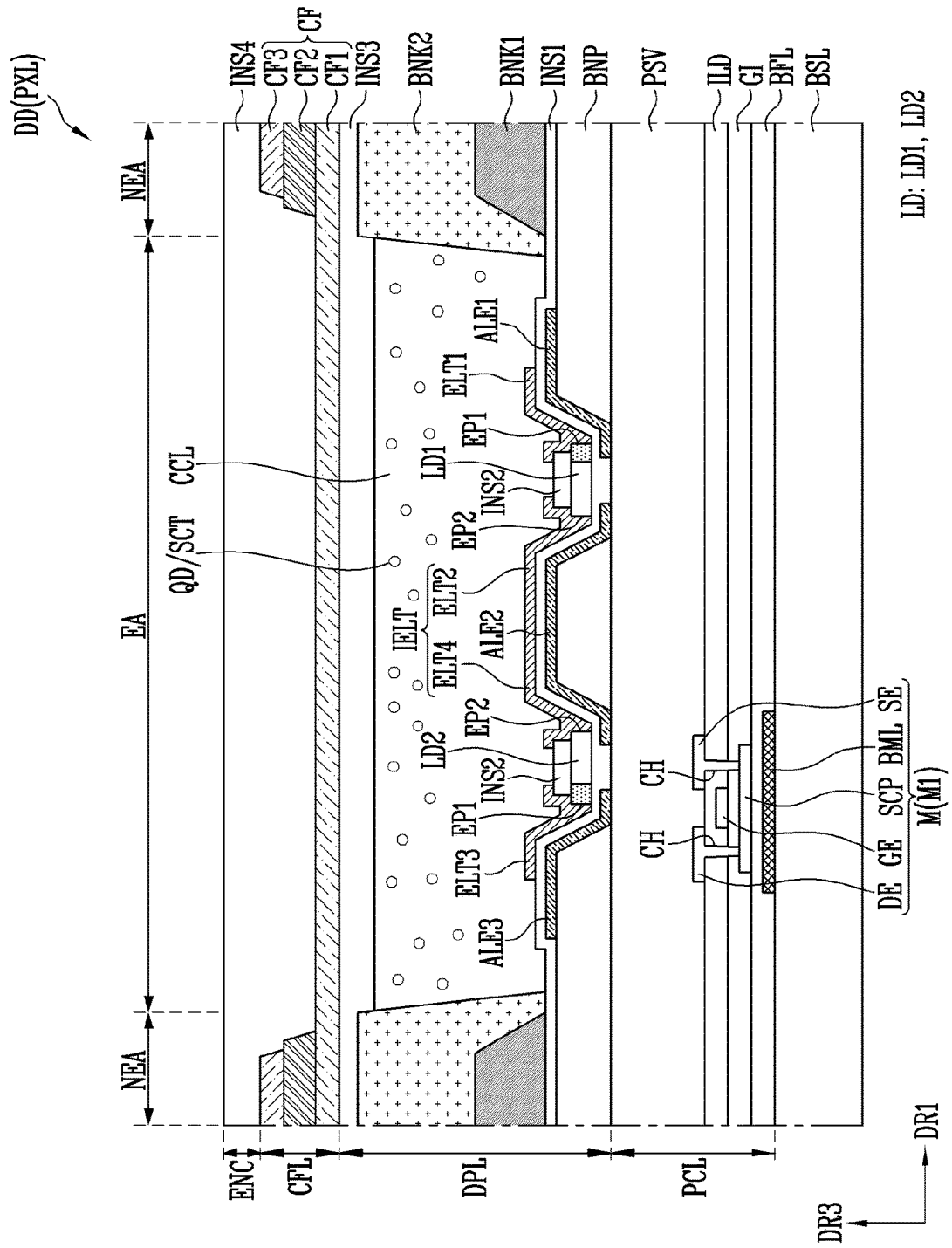
FIG. 12 is a cross-sectional view schematically illustrating a pixel and the display device including the same according to an embodiment of the disclosure.

FIG. 12 is a schematic cross-sectional view illustrating a pixel PXL and the display device DD including the same according to an embodiment. For example, FIG. 12 schematically illustrates a cross-section of the display device DD, centering on a pixel area in which a pixel PXL is disposed.

FIG. 12 illustrates, as an example of circuit elements that may be disposed in a pixel circuit layer PCL of the display device DD, any transistor M (for example, the first transistor M1 including the bottom metal layer BML) provided in each pixel PXL. Circuit elements configuring the current generator CRG and the current controller CRC of each of the pixels PXL, and various signal lines and/or power lines electrically connected to the pixels PXL may be further disposed in the pixel circuit layer PCL.

FIG. 12 illustrates, as an example of light emitting elements LD that may be disposed in a display layer DPL of the display device DD and electrodes electrically connected thereto, the first electrode ELT1, the second electrode ELT2, and any first light emitting element LD1 provided in the first light emitting part EMU1, the third electrode ELT3, the fourth electrode ELT4, and any second light emitting element LD2 provided in the second light emitting part EMU2, as in the embodiment of FIG. 5 or the like. At least one other electrode, insulating pattern, and/or the like may be further disposed in the display layer DPL.

Referring to FIGS. 3 to 12, the display device DD may include the base layer BSL, the pixel circuit layer PCL, and the display layer DPL. In an embodiment, the pixel circuit layer PCL and the display layer DPL may be disposed on the base layer BSL to overlap each other. For example, the pixel circuit layer PCL and the display layer DPL may be sequentially disposed on a surface of the base layer BSL.

The display device DD may further include a color filter layer CFL and/or an encapsulation layer ENC (or a protective layer) disposed on the display layer DPL. In an embodiment, the color filter layer CFL and/or the encapsulation layer ENC may be formed directly on a surface of the base layer BSL on which the pixel circuit layer PCL and the display layer DPL are formed, but the disclosure is not limited thereto. For example, a separate upper substrate may be disposed on a surface of the base layer BSL including the display layer DPL, and the color filter layer CFL may be formed on the upper substrate.

The base layer BSL, the pixel circuit layer PCL, the display layer DPL, the color filter layer CFL, and/or the encapsulation layer ENC may configure the display panel DPN of the display device DD.

The base layer BSL may be a rigid substrate or a flexible substrate or film, and a material or a structure thereof is not particularly limited. For example, the base layer BSL may include an insulating member such as a glass substrate or a polymer film and may be a single layer or multiple layers of a substrate or film.

The pixel circuit layer PCL may be provided on a surface of the base layer BSL. The pixel circuit layer PCL may include circuit elements configuring each pixel PXL. For example, the first to fifth transistors M1 to M5 and the first and second capacitors C1 and C2 may be formed in each pixel area of the pixel circuit layer PCL.

The pixel circuit layer PCL may include various signal lines and power lines electrically connected to the pixels PXL. For example, the pixel circuit layer PCL may include the scan lines SL, the data lines DL, the initialization power lines INL, and the first and second power lines PL1 and PL2.

The pixel circuit layer PCL may include insulating layers. For example, the pixel circuit layer PCL may include a buffer layer BFL, a gate insulating layer GI, an interlayer insulating layer ILD, and/or a passivation layer PSV sequentially disposed on the surface of the base layer BSL.

The pixel circuit layer PCL may be disposed on the base layer BSL and may include a first conductive layer including the bottom metal layer BML of the first transistor M1. For example, the first conductive layer may be disposed between the base layer BSL and the buffer layer BFL and include the bottom metal layers BML of the first transistors M1 included in the pixels PXL.

The first conductive layer may further include at least one line and/or at least one bridge pattern. For example, the first conductive layer may include at least some lines extending in a second direction DR2 (or a first direction DR1) in the display area DA. For example, the first conductive layer may include the first power line PL1, the initialization power line INL, and/or the data lines DL.

The buffer layer BFL may be disposed on a surface of the base layer BSL including the first conductive layer. The buffer layer BFL may prevent diffusion of an impurity into each circuit element.

The semiconductor layer may be disposed on the buffer layer BFL. The semiconductor layer may include semiconductor patterns SCP of the transistors M. Each semiconductor pattern SCP may have a channel region overlapping a gate electrode GE of the corresponding transistor M, and first and second conductive regions (for example, source and drain regions) disposed on both sides of the channel region. Each semiconductor pattern SCP may be a semiconductor pattern formed of polysilicon, amorphous silicon, oxide semiconductor, or the like.

The gate insulating layer GI may be disposed on the semiconductor layer. A second conductive layer may be disposed on the gate insulating layer GI.

The second conductive layer may include the gate electrodes GE of the transistors M. The second conductive layer may further include an electrode of each of the first and second capacitors C1 and C2, a bridge pattern, and/or the like. In case that at least one power line and/or at least one signal line disposed in the display area DA is configured of multiple layers, the second conductive layer may further include at least one conductive pattern configuring the at least one power line and/or the at least one signal line.

The interlayer insulating layer ILD may be disposed on the second conductive layer. A third conductive layer may be disposed on the interlayer insulating layer ILD.

The third conductive layer may include source electrodes SE and drain electrodes DE of the transistors M. Each source electrode SE may be electrically connected to a region (for example, the source region) of the semiconductor pattern SCP included in the corresponding transistor M through at least one contact hole CH, and each drain electrode DE may be electrically connected to another region (for example, the drain region) of the semiconductor pattern SCP included in the corresponding transistor M through at least one other contact hole CH.

The third conductive layer may further include an electrode of each of the first and second capacitors C1 and C2, at least one line, and/or at least one bridge pattern. For example, the third conductive layer may include at least some of the lines extending in the first direction DR1 (or the second direction DR2) in the display area DA. For example, the third conductive layer may include the second power line PL2 and the scan lines SL. In case that at least one power line and/or at least one signal line disposed in the display area DA is configured of multiple layers, the third conductive layer may further include at least one conductive pattern configuring the at least one power line and/or the at least one signal line.

Each conductive pattern, electrode, and/or line configuring the first to third conductive layers may have conductivity by including at least one conductive material, and a material thereof is not particularly limited. For example, each conductive pattern, electrode, and/or line configuring the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of conductive materials.

The passivation layer PSV may be disposed on the third conductive layer. Each of the buffer layer BFL, the gate insulating layer GI, the interlayer insulating layer ILD, and the passivation layer PSV may be configured of a single layer or multiple layers, and may include at least one inorganic insulating material and/or organic insulating material. For example, each of the buffer layer BFL, the gate insulating layer GI, the interlayer insulating layer ILD, and the passivation layer PSV may include various types of organic/inorganic insulating materials including silicon nitride ($SiN_x$), silicon oxide ($SiO_x$), silicon oxynitride ($SiO_xN_y$), and the like. In an embodiment, the passivation layer PSV may include an organic insulating layer and may planarize a surface of the pixel circuit layer PCL.

The display layer DPL may be disposed on the passivation layer PSV.

The display layer DPL may include the first and second light emitting parts EMU1 and EMU2 of the pixels PXL. For example, the display layer DPL may include the first and second electrodes ELT1 and ELT2 and the first light emitting elements LD1 configuring the first light emitting part EMU1 of each pixel PXL, and the third and fourth electrodes ELT3 and ELT4 and the second light emitting elements LD2 configuring the second light emitting part EMU2 of each pixel PXL. The display layer DPL may include a first alignment electrode ALE1 overlapping the first electrode ELT1, a second alignment electrode ALE2 overlapping the second electrode ELT2, and a third alignment electrode ALE3 overlapping the third electrode ELT3. In an embodiment, the second electrode ELT2 and the fourth electrode ELT4 may configure an integrated electrode IELT, and the second alignment electrode ALE2 may overlap the integrated electrode IELT.

The first and second light emitting elements LD1 and LD2 may be provided in an emission area EA of the pixel PXL. The first to fourth electrodes ELT1 to ELT4 and the first to third alignment electrodes ALE1 to ALE3 may be provided in the emission area EA of the pixel PXL. At least one of the first to fourth electrodes ELT1 to ELT4 and the first to third alignment electrodes ALE1 to ALE3 may extend to a non-emission area NEA.

The display layer DPL may further include insulating patterns and/or insulating layers sequentially disposed on a surface of the base layer BSL on which the pixel circuit layer PCL is formed. For example, the display layer DPL may include bank patterns BNP, a first insulating layer INS1, a first bank BNK1, a second insulating layer INS2, a second bank BNK2, and a third insulating layer INS3. The display layer DPL may selectively further include a light conversion layer CCL.

The bank patterns BNP (also referred to as "patterns" or "wall patterns") may be provided and/or formed on the passivation layer PSV. The bank patterns BNP may be disposed under the first, second, and third alignment electrodes ALE1, ALE2, and ALE3 so as to overlap a portion of each of the first, second, and third alignment electrodes ALE1, ALE2, and ALE3.

The first, second, and third alignment electrodes ALE1, ALE2, and ALE3 may protrude in an upper direction (for example, in a third direction DR3) around the light emitting elements LD by the bank patterns BNP. The bank patterns BNP and the first, second, and third alignment electrodes ALE1, ALE2, and ALE3 may form a reflective protrusion pattern around the light emitting elements LD. Accordingly, light efficiency of each pixel PXL may be improved.

The bank patterns BNP may include an inorganic insulating layer formed of an inorganic material or an organic insulating layer formed of an organic material. The bank patterns BNP may be formed of a single layer or multiple layers. The first, second, and third alignment electrodes ALE1, ALE2, and ALE3 may be formed on the bank patterns BNP.

The first, second, and third alignment electrodes ALE1, ALE2, and ALE3 may include at least one conductive material. For example, the first, second, and third alignment electrodes ALE1, ALE2, and ALE3 may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but the disclosure is not limited thereto. For example, the first, second, and third alignment electrodes ALE1, ALE2, and ALE3 may include another conductive material such as carbon nanotubes or graphene. For example, the first, second, and third alignment electrodes ALE1, ALE2, and ALE3 may have conductivity by including at least one of various conductive materials. The first, second, and third alignment electrodes ALE1, ALE2, and ALE3 may include the same conductive material or different conductive materials.

The first, second, and third alignment electrodes ALE1, ALE2, and ALE3 may configure alignment lines to which alignment signals for aligning the light emitting elements LD are applied in an alignment step of the light emitting elements LD. The first, second, and third alignment electrodes ALE1, ALE2, and ALE3 may be separated into alignment electrodes of each pixel PXL by an etching process or the like after the alignment of the light emitting elements LD is completed.

Each of the first, second, and third alignment electrodes ALE1, ALE2, and ALE3 may be configured of a single layer or multiple layers. For example, the first, second, and third alignment electrodes ALE1, ALE2, and ALE3 may include a reflective electrode layer including a reflective conductive material (for example, metal). The first, second, and third alignment electrodes ALE1, ALE2, and ALE3 may selectively further include at least one of a transparent electrode layer disposed on and/or under the reflective electrode layer, and a conductive capping layer covering an upper portion of the reflective electrode layer and/or the transparent electrode layer.

FIG. 12 illustrates an embodiment in which the first, second, and third alignment electrodes ALE1, ALE2, and ALE3 are disposed in the emission area EA of each pixel PXL, but the number of alignment electrodes disposed in each emission area EA is not limited thereto. For example, at least one pair of alignment electrodes may be disposed in each emission area EA, and the light emitting elements LD may be disposed between a pair of alignment electrodes.

The first insulating layer INS1 may be disposed on the first, second, and third alignment electrodes ALE1, ALE2, and ALE3. In an embodiment, the first insulating layer INS1 may include contact holes (for example, first, second, and third contact holes CH1, CH2, and CH3 of FIG. 17) for electrically connecting the first, second, and third alignment electrodes ALE1, ALE2, and ALE3 to the first, second, and third electrodes ELT1, ELT2, and ELT3, respectively. In another embodiment, the first insulating layer INS1 may be formed entirely on the display area DA in which the first, second, and third alignment electrodes ALE1, ALE2, and ALE3 are formed, and may include opening portions (or openings) exposing a portion of each of the first, second, and third alignment electrodes ALE1, ALE2, and ALE3. In a region in which the contact holes are formed in the first insulating layer INS1 (or a region in which the first insulating layer INS1 is opened), the first, second, and third alignment electrodes ALE1, ALE2, and ALE3 may be electrically connected to the first, second, and third electrodes ELT1, ELT2, and ELT3, respectively. In still another embodiment, the first insulating layer INS1 may be locally disposed only under a region in which the light emitting elements LD are arranged.

The first insulating layer INS1 may be configured of a single layer or multiple layers, and may include at least one inorganic insulating material and/or an organic insulating material. In an embodiment, the first insulating layer INS1 may include at least one type of inorganic insulating material including silicon nitride ($SiN_x$), silicon oxide ($SiO_x$), or silicon oxynitride ($SiO_xN_y$).

As the first, second, and third alignment electrodes ALE1, ALE2, and ALE3 are covered by the first insulating layer INS1, damage to the first, second, and third alignment electrodes ALE1, ALE2, and ALE3 in a subsequent process may be prevented. An occurrence of a short defect due to an improper connection between the first, second, and third alignment electrodes ALE1, ALE2, and ALE3 and the light emitting elements LD may be prevented.

The first bank BNK1 may be disposed in the display area DA in which the first, second, and third alignment electrodes ALE1, ALE2, and ALE3 and the first insulating layer INS1 are formed. The first bank BNK1 may have opening portions corresponding to the emission areas EA of the pixels PXL, and may be formed in the non-emission area NEA to surround each of the emission areas EA. Accordingly, each emission area EA to which the light emitting elements LD are to be supplied may be defined (or partitioned). In an embodiment, the first bank BNK1 may include a light blocking and/or reflective material including a black matrix material or the like. Accordingly, light interference between the pixels PXL may be prevented.

The light emitting elements LD may be supplied to each emission area EA surrounded by the first bank BNK1. The light emitting elements LD may be aligned among the first, second, and third alignment electrodes ALE1, ALE2, and ALE3, by the alignment signals applied to the first, second, and third alignment electrodes ALE1, ALE2, and ALE3 (or first, second, and third alignment lines) in a process of manufacturing the pixel PXL. In an embodiment, a third alignment signal may be the same as a first alignment signal. In this case, the first alignment line and the third alignment line may be electrically connected to each other until the alignment of the light emitting elements LD is completed.

For example, some of the light emitting elements LD supplied to each emission area EA (for example, at least one first light emitting element LD1) may be arranged in the first direction DR1, a diagonal direction, or the like so that the first end portion EP1 faces the first alignment electrode ALE1, and the second end portion EP2 faces the second alignment electrode ALE2. Another portion of the light emitting elements LD supplied to each emission area EA (for example, at least one second light emitting element LD2) may be arranged in the first direction DR1, a diagonal direction, or the like so that the first end portion EP1 faces the third alignment electrode ALE3, and the second end portion EP2 faces the second alignment electrode ALE2.

The second insulating layer INS2 (or also referred to as an "insulating pattern") may be disposed on a portion of the light emitting elements LD. For example, the second insulating layer INS2 may be disposed locally on a portion including a central portion of the light emitting elements LD to expose the first and second end portions EP1 and EP2 of the light emitting elements LD arranged in the emission area EA of the pixel PXL. In case that the second insulating layer INS2 is formed on the light emitting elements LD, the light emitting elements LD may be stably fixed, and a short defect may be prevented.

The second insulating layer INS2 may be configured of a single layer or multiple layers and may include at least one inorganic insulating material and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), aluminum oxide ($Al_xO_y$), and photoresist (PR) material.

Different electrodes among the first electrode ELT1, the second electrode ELT2, the third electrode ELT3, and the fourth electrode ELT4 may be formed on both end portions of the light emitting elements LD, which are not covered by the second insulating layer INS2, for example, the first and second end portions EP1 and EP2. For example, the first electrode ELT1 may be disposed on the first end portion EP1 of the first light emitting element LD1, and the second electrode ELT2 (or the integrated electrode IELT) may be disposed on the second end portion EP2 of the first light emitting element LD1. The third electrode ELT3 may be disposed on the first end portion EP1 of the second light emitting element LD2, and the fourth electrode ELT4 (or the integrated electrode IELT) may be disposed on the second end portion EP2 of the second light emitting element LD2.

The first electrode ELT1 may be electrically connected to the first end portion EP1 of the first light emitting element LD1, and the second electrode ELT2 may be electrically connected to the second end portion EP2 of the first light emitting element LD1. The third electrode ELT3 may be electrically connected to the first end portion EP1 of the second light emitting element LD2, and the fourth electrode ELT4 may be electrically connected to the second end portion EP2 of the second light emitting element LD2.

In an embodiment, the first electrode ELT1 may be electrically connected to the first alignment electrode ALE1 and may be electrically connected to the first transistor M1 through the first alignment electrode ALE1. The second electrode ELT2 and the fourth electrode ELT4 may be electrically connected to the second alignment electrode ALE2 and may be electrically connected to the second power line PL2 through the second alignment electrode ALE2. The third electrode ELT3 may be electrically connected to the third alignment electrode ALE3 and may be electrically connected to the third transistor M3 through the third alignment electrode ALE3.

For example, FIG. 12 illustrates that the first alignment electrode ALE1 and the first electrode ELT1 are separated from each other, but the first alignment electrode ALE1 and the first electrode ELT1 may be electrically connected to each other through at least one contact hole (or contact portion) in a region that is not shown. Similarly, the second alignment electrode ALE2, the second electrode ELT2, and the fourth electrode ELT4 may be electrically connected to each other through at least one contact hole (or contact portion), and the third alignment electrode ALE3 and the third electrode ELT3 may be electrically connected to each other through at least one contact hole (or contact portion).

FIG. 12 illustrates that the first transistor M1 and the first alignment electrode ALE1 are separated from each other, but the first transistor M1 and the first alignment electrode ALE1 (or the first electrode ELT1) of each pixel PXL may be electrically connected to each other through at least one contact hole (or contact portion) in a region that is not shown. Similarly, the second alignment electrode ALE2 (or the second electrode ELT2 and/or the fourth electrode ELT4) of each pixel PXL may be electrically connected to the second power line PL2 through at least one contact hole (or contact portion), and the fourth transistor M4 and the third alignment electrode ALE3 (or the third electrode ELT3) of each pixel PXL may be electrically connected to each other through at least one contact hole (or contact portion).

The first electrode ELT1 may be disposed on the first alignment electrode ALE1 to overlap a portion of the first alignment electrode ALE1, and the second electrode ELT2 may be disposed on the second alignment electrode ALE2 to overlap a portion of the second alignment electrode ALE2. The third electrode ELT3 may be disposed on the third alignment electrode ALE3 to overlap a portion of the third alignment electrode ALE3, and the fourth electrode ELT4 may be disposed on the second alignment electrode ALE2 to overlap a portion of the second alignment electrode ALE2.

The first and second electrodes ELT1 and ELT2 may be formed on the same layer or different layers, and the third and fourth electrodes ELT3 and ELT4 may be formed on the same or different layers. For example, the first, second, third, and fourth electrodes ELT1, ELT2, ELT3, and ELT4 may be simultaneously formed on the same layer. As another example, the first and third electrodes ELT1 and ELT3 may be formed on the same layer, the second and fourth electrodes ELT2 and ELT4 may be formed on the same layer, and the second and fourth electrodes ELT2 and ELT4 may be formed on a layer different from that of the first and third electrodes ELT1 and ELT3 with at least one insulating layer (or insulating pattern) interposed therebetween. A mutual position and/or a formation order of the first electrode ELT1, the second electrode ELT2, the third electrode ELT3, and/or the fourth electrode ELT4 may be variously changed according to an embodiment.

The first, second, third, and fourth electrodes ELT1, ELT2, ELT3, and ELT4 may have conductivity by including at least one conductive material. The first electrode ELT1, the second electrode ELT2, the third electrode ELT3, and/or the fourth electrode ELT4 may include the same conductive material or different conductive materials. In an embodiment, the first, second, third, and fourth electrodes ELT1, ELT2, ELT3, and ELT4 may include a transparent conductive material so that light emitted from the light emitting elements LD may transmit.

In an embodiment, the display device DD may include the light conversion layer CCL provided on the light emitting elements LD. For example, the light conversion layer CCL may be disposed in each emission area EA in which the light emitting elements LD are arranged.

The display device DD may further include the second bank BNK2 disposed in the non-emission area NEA to overlap the first bank BNK1. The second bank BNK2 may define (or partition) each emission area EA in which the light conversion layer CCL is to be formed. In an embodiment, the second bank BNK2 may be integrated with (or integral with) the first bank BNK1. In an embodiment, the light conversion layer CCL and the second bank BNK2 may be formed in the display layer DPL, but the disclosure is not limited thereto.

The second bank BNK2 may include a light blocking and/or reflective material including a black matrix material or the like. Accordingly, light interference between the pixels PXL may be prevented. The second bank BNK2 and the first bank BNK1 may include the same material or different materials.

The light conversion layer CCL may include wavelength conversion particles (or color conversion particles) that convert a wavelength and/or a color of the light emitted from the light emitting elements LD, and/or light scattering particles SCT that increase light emission efficiency by scattering the light emitted from the light emitting elements LD. For example, in each emission area EA, each light conversion layer CCL including the wavelength conversion particles including at least one type of quantum dot QD (for example, red, green, and/or blue quantum dots), and/or the light scattering particles SCT may be provided.

For example, in case that any pixel PXL is set as a red (or green) pixel, and blue light emitting elements LD are provided to the emission area EA of the pixel PXL, a light conversion layer CCL including a red (or green) quantum dot QD for converting blue light into red (or green) light may be disposed on the blue light emitting elements LD. The light conversion layer CCL may further include the light scattering particles SCT.

The third insulating layer INS3 may be formed on the surface of the base layer BSL including the first and second light emitting parts EMU1 and EMU2 and/or the light conversion layers CCL of the pixels PXL.

In an embodiment, the third insulating layer INS3 may include an organic insulating layer and/or an inorganic insulating layer, and may substantially planarize a surface of the display layer DPL. The third insulating layer INS3 may protect the first and second light emitting parts EMU1 and EMU2 and/or the light conversion layers CCL of the pixels PXL.

The color filter layer CFL may be disposed on the third insulating layer INS3.

The color filter layer CFL may include color filters CF corresponding to the colors of the pixels PXL. For example, the color filter layer CFL may include a first color filter CF1 (for example, a red color filter) disposed in the emission area EA of a first color pixel (for example, a red pixel), a second color filter CF2 (for example, a green color filter) disposed in the emission area EA of a second color pixel (for example, a green pixel), and a third color filter CF3 (for example, a blue color filter) disposed in the emission area EA of a third color pixel (for example, a blue pixel). In an embodiment, the first, second, and third color filters CF1, CF2, and CF3 may be disposed to overlap each other in the non-emission area NEA to block light interference between the pixels PXL. In another embodiment, the first, second, and third color filters CF1, CF2, and CF3 may be formed to be separated from each other, and a separate light blocking pattern or the like may be disposed between the first, second, and third color filters CF1, CF2, and CF3.

The encapsulation layer ENC may be disposed on the color filter layer CFL. The encapsulation layer ENC may include at least one organic insulating layer and/or inorganic insulating layer including a fourth insulating layer INS4. The fourth insulating layer INS4 may be entirely formed in the display area DA to cover the pixel circuit layer PCL, the display layer DPL, and/or the color filter layer CFL.

The fourth insulating layer INS4 may be configured of a single layer or multiple layers and may include at least one inorganic insulating material and/or organic insulating material. For example, the fourth insulating layer INS4 may include various types of organic/inorganic insulating materials including silicon nitride ($SiN_x$), silicon oxide ($SiO_x$), silicon oxynitride ($SiO_xN_y$), or aluminum oxide ($Al_xO_y$).

In an embodiment, the fourth insulating layer INS4 may be formed of multiple layers. For example, the fourth insulating layer INS4 may include at least two inorganic insulating layers and at least one organic insulating layer interposed between the at least two inorganic insulating layers. However, the material and/or structure of the fourth insulating layer INS4 may be variously changed. According to an embodiment, at least one overcoat layer, at least one filler layer, and/or at least one upper substrate may be further disposed on the fourth insulating layer INS4.

Figure 13:
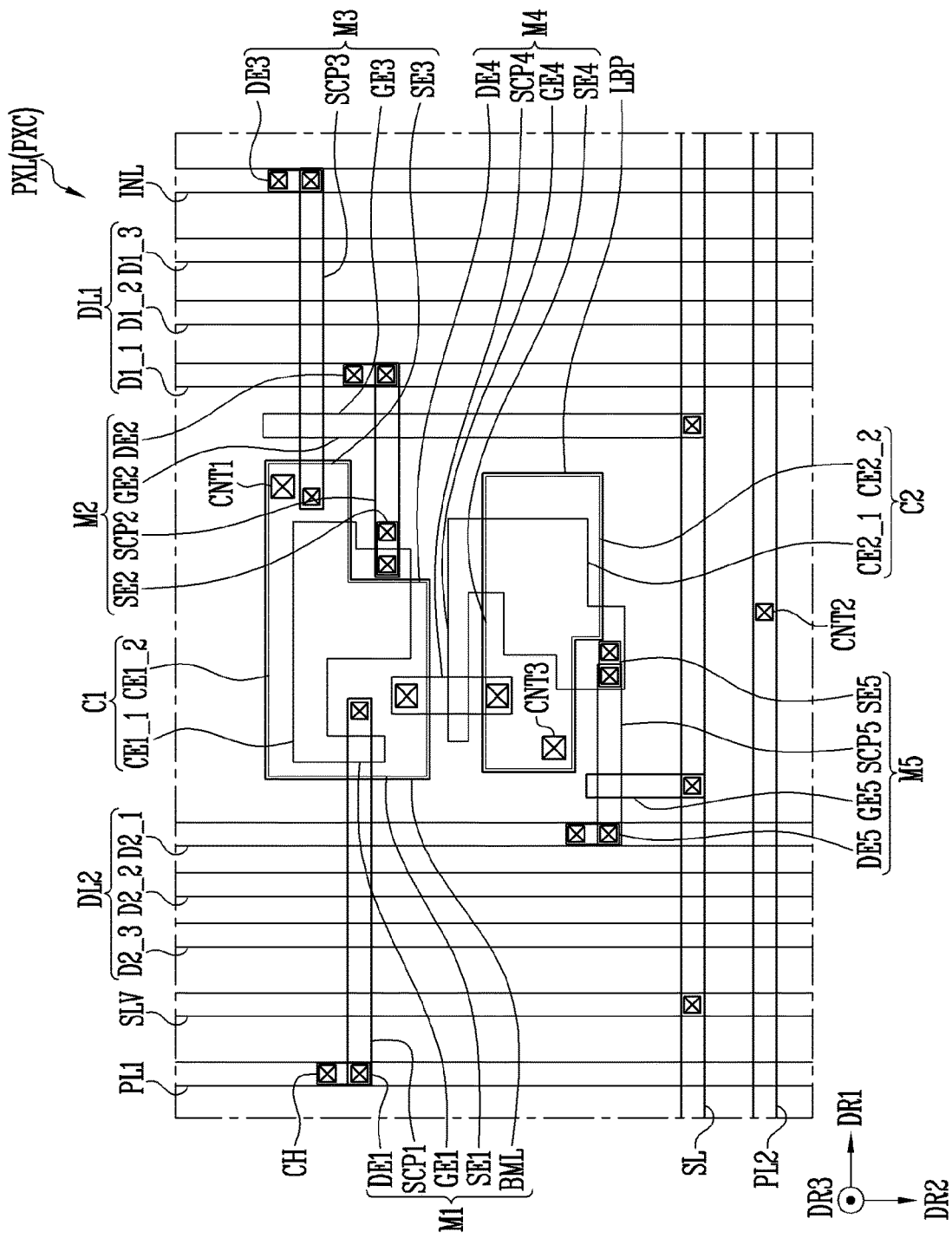
FIGS. 13 to 16 are plan views each schematically illustrating a pixel according to an embodiment of the disclosure.
Figure 14:
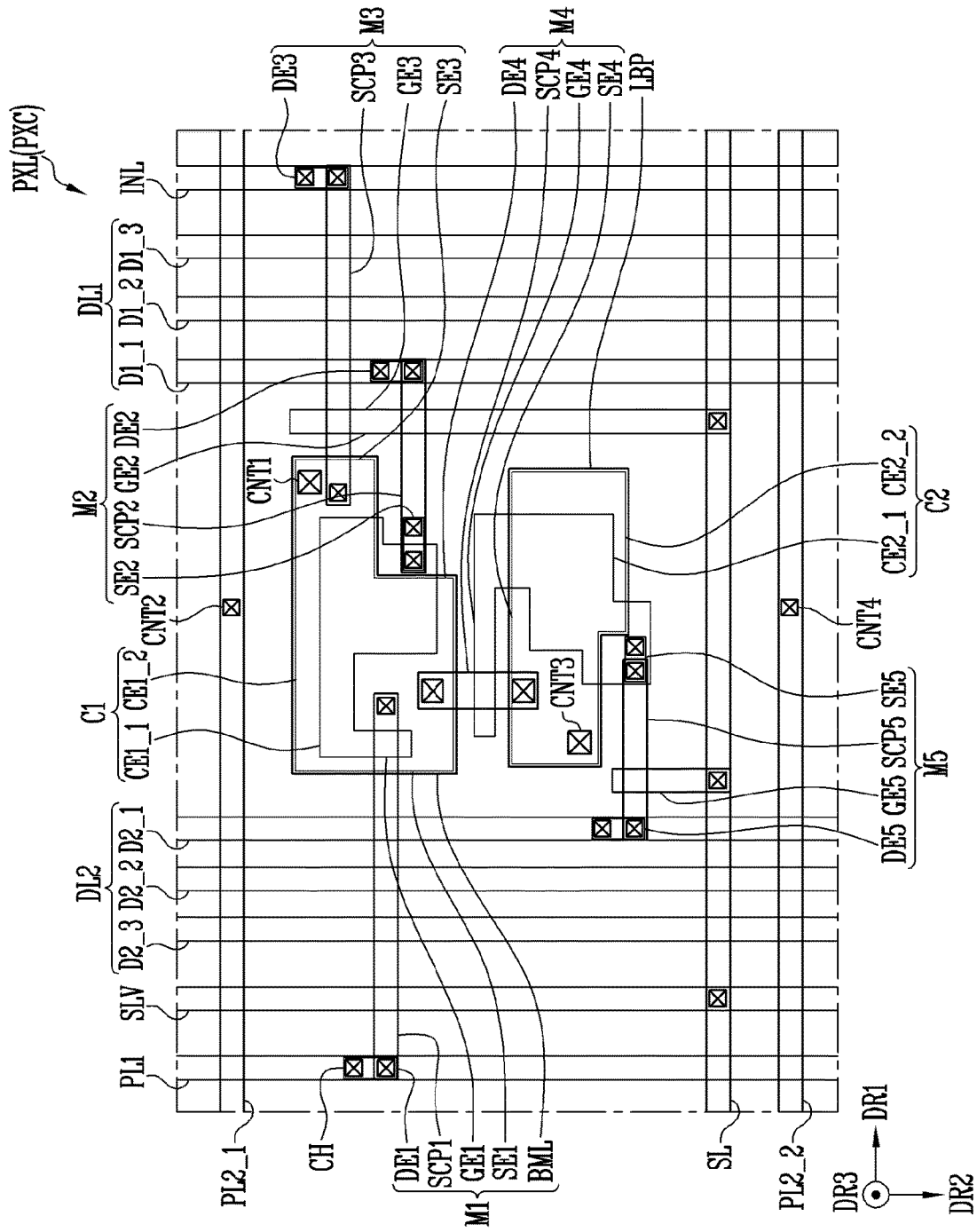
Figure 15:
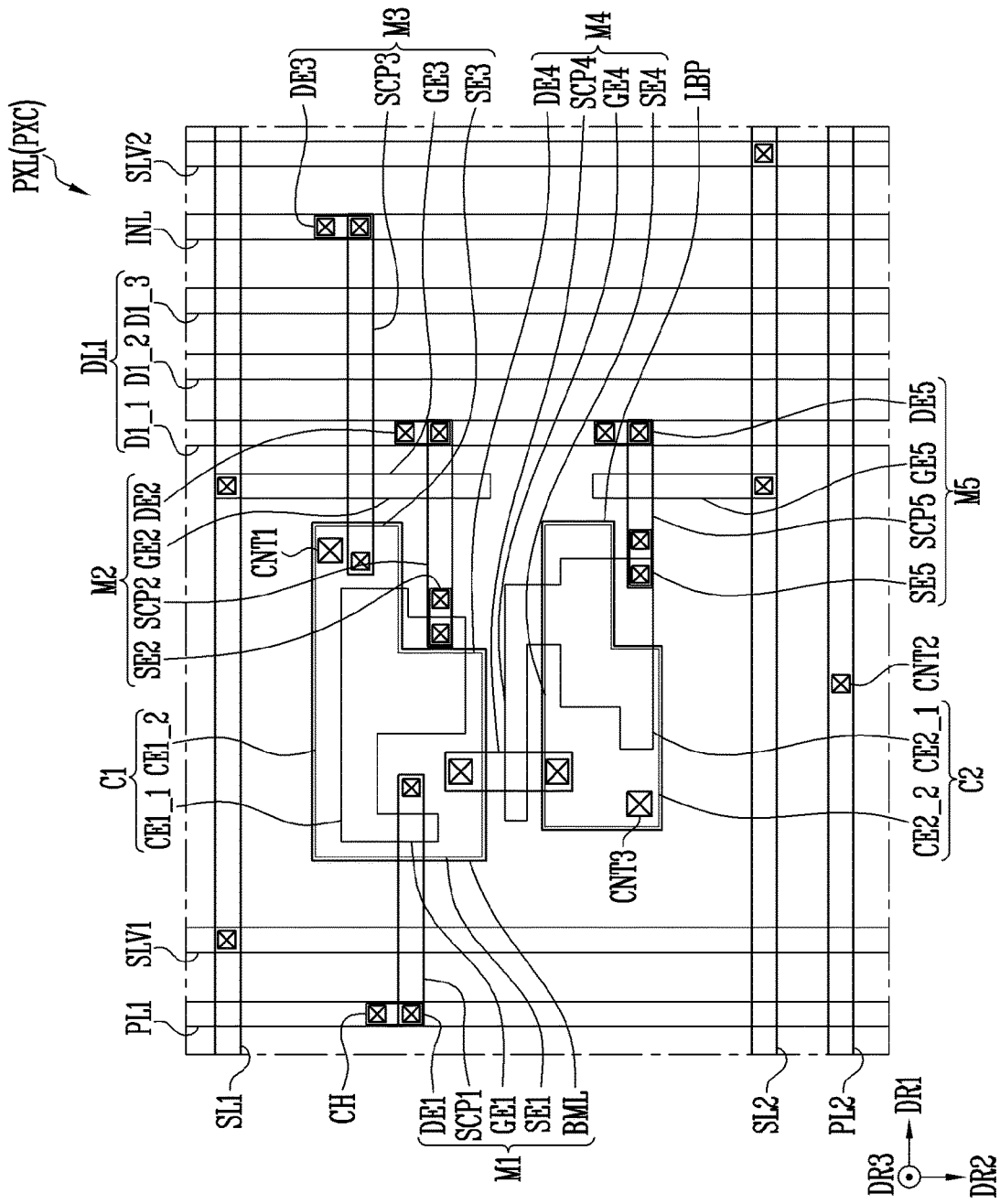
Figure 16:
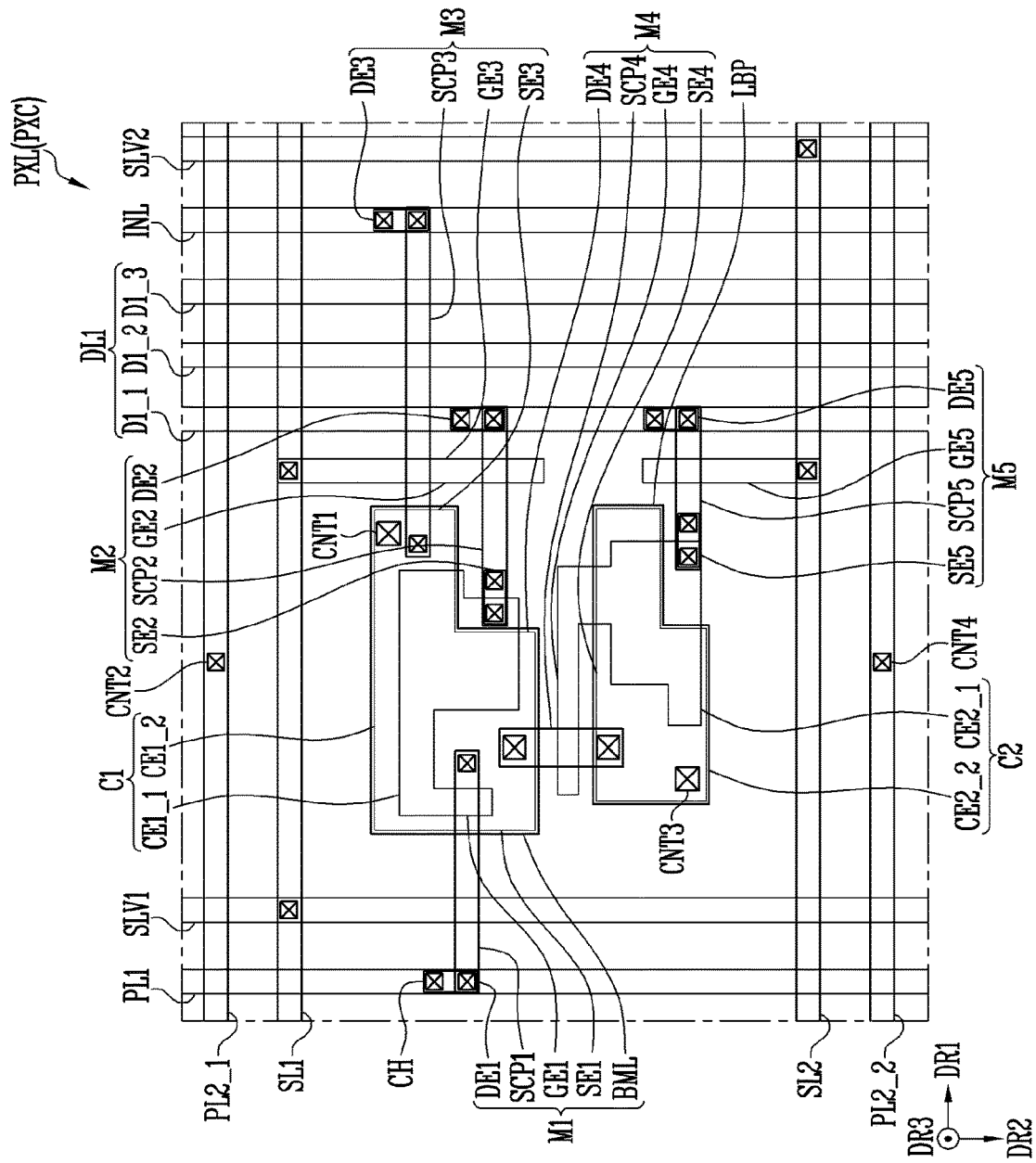

FIGS. 13 to 16 are schematic plan views each illustrating a pixel PXL according to an embodiment. For example, FIG. 13 illustrates a pixel circuit PXC of the pixel PXL according to the embodiment of FIG. 5, and FIG. 14 illustrates a pixel circuit PXC of the pixel PXL according to the embodiment of FIG. 6. FIG. 15 illustrates a pixel circuit PXC of the pixel PXL according to the embodiment of FIG. 9, and FIG. 16 illustrates a pixel circuit PXC of the pixel PXL according to the embodiment of FIG. 10. Each pixel circuit PXC shown in FIGS. 13 to 16 may be a configuration including the current generator CRG and the current controller CRC. In the embodiments of FIGS. 13 to 16, the same reference numerals are assigned to configurations that are similar or identical to each other, and a detailed description of overlapping elements is omitted. In an embodiment, circuit elements provided to the pixel PXL and lines electrically connected thereto may be disposed in the pixel circuit layer PCL of FIG. 12.

Referring to FIGS. 3, 5, 12, and 13, lines electrically connected to the pixel PXL may be disposed around the pixel PXL. For example, around the pixel PXL, the scan line SL, the first data line DL1, the second data line DL2, the first power line PL1, the second power line PL2, and the initialization power line INL electrically connected to the pixel PXL may be disposed.

In an embodiment, the control line SSL may be integrated with the scan line SL. In this case, the gate electrode of the third transistor M3 may be electrically connected to the scan line SL.

In an embodiment, pixels PXL of at least two colors may be disposed in each pixel column. In this case, first data lines DL1 and second data lines DL2 may be disposed in each pixel column. The first data lines DL1 may be electrically connected to the pixels PXL of different colors, and the second data lines DL2 may be electrically connected to the pixels PXL of different colors. For example, first color pixels arranged in each pixel column may be electrically connected to a (1_1)-th data line D1_1 and a (2_1)-th data line D2_1, and second color pixels arranged in each pixel column may be electrically connected to a (1_2)-th data line D1_2 and a (2_2)-th data line D2_2. Third color pixels arranged in each pixel column may be electrically connected to a (1_3)-th data line D1_3 and a (2_3)-th data line D2_3.

Each line may be formed to extend in the first direction DR1 or the second direction DR2 in the display area DA. For example, the scan line SL and the second power line PL2 may extend in the first direction DR1, the first data lines DL1, the second data lines DL2, the first power line PL1, and the initialization power line INL may extend in the second direction DR2.

In an embodiment, at least one line may be formed as a mesh-type line, and in this case, the at least one line includes a main line extending in the first direction DR1 or the second direction DR2, and a sub line intersecting and electrically connected to the main line. For example, the scan line SL may extend in the first direction DR1 and may be electrically connected to a sub scan line SLV extending in the second direction DR2. In this case, even though the display device DD is a single-side driving display device that supplies scan signals through pads and/or a driving circuit disposed on an upper side or a lower side of the display area DA, each scan signal may be supplied to the pixels PXL in a horizontal line unit.

In a similar method, at least one power line (for example, the first power line PL1, the second power line PL2, and/or the initialization power line INL) may also be formed as a mesh-type line. In this case, power of a uniform level may be supplied to the pixels PXL of the display area DA.

The lines extending in the first direction DR1 and the lines extending in the second direction DR2 may be disposed on different layers of the pixel circuit layer PCL. For example, the lines extending in the first direction DR1 may be disposed on the third conductive layer of the pixel circuit layer PCL together with the source electrodes SE and the drain electrodes DE of the transistors M, and the lines extending in the second direction DR2 may be disposed on the first conductive layer of the pixel circuit layer PCL together with the bottom metal layer BML of at least some of the transistors M (for example, the first transistor M1 of each pixel PXL). Each line may be formed of a single layer or multiple layers of line, and positions, structures, shapes, arrangement, and/or directions, and/or the like of the lines may be variously changed according to an embodiment.

In an embodiment, circuit elements, electrodes, and/or lines disposed in the pixel circuit layer PCL may be electrically connected to each other through at least one contact hole CH formed in the pixel circuit layer PCL. For convenience, FIG. 13 illustrates only a single contact hole CH on behalf of the contact holes CH for electrically connecting specific elements in the pixel circuit layer PCL.

The pixel circuit layer PCL may further include at least one contact portion formed between the pixel circuit layer PCL and the display layer DPL. For example, the pixel circuit layer PCL may include a first contact portion CNT1, a second contact portion CNT2, and a third contact portion CNT3.

The first contact portion CNT1 may electrically connect the first node N1, to which the first transistor M1, the third transistor M3, the fourth transistor M4, and the first capacitor C1 of the pixel circuit layer PCL are electrically connected, to the first electrode ELT1 of the display layer DPL. The second contact portion CNT2 may electrically connect the second power line PL2 of the pixel circuit layer PCL to the second electrode ELT2 and the fourth electrode ELT4 of the display layer DPL. The third contact portion CNT3 may electrically connect the fourth transistor M4 of the pixel circuit layer PCL to the third electrode ELT3 of the display layer DPL.

Each of the first contact portion CNT1, the second contact portion CNT2, and the third contact portion CNT3 may be configured of at least one contact hole and/or at least one via hole. Positions of the first contact portion CNT1, the second contact portion CNT2, and the third contact portion CNT3 may be variously changed according to a design structure of the pixel circuit layer PCL and the display layer DPL.

The pixel circuit PXC may include the first transistor M1, the second transistor M2, the third transistor M3, and the first capacitor C1 configuring the current generator CRG. The pixel circuit PXC may further include the fourth transistor M4, the fifth transistor M5, and the second capacitor C2 configuring the current controller CRC.

The first transistor M1 may include a first semiconductor pattern SCP1, a first gate electrode GE1, a first source electrode SE1, and a first drain electrode DE1. The first transistor M1 may further include the bottom metal layer BML overlapping the first gate electrode GE1 and the first semiconductor pattern SCP1.

The first semiconductor pattern SCP1 may overlap the first gate electrode GE1 and the bottom metal layer BML and may be electrically connected to the first source electrode SE1 and the first drain electrode DEL. For example, both end portions of the first semiconductor pattern SCP1 may be electrically connected to the first source electrode SE1 and the first drain electrode DE1 through respective contact holes CH.

The first gate electrode GE1 may be electrically connected to a first electrode CE1_1 and a second source electrode SE2 of the first capacitor C1. For example, the first gate electrode GE1 may be integrally electrically connected to the first electrode CE1_1 of the first capacitor C1 and may be electrically connected to the second source electrode SE2 through at least one contact hole CH.

The first source electrode SE1 may be electrically connected to a second electrode CE1_2 of the first capacitor C1, a third source electrode SE3, and a fourth drain electrode DE4. For example, the first source electrode SE1 may be integrally electrically connected to the second electrode CE1_2 of the first capacitor C1, the third source electrode SE3, and the fourth drain electrode DE4. The first source electrode SE1 may be electrically connected to the first electrode ELT1 formed in the display layer DPL through the first contact portion CNT1. For example, the first source electrode SE1, the second electrode CE1_2 of the first capacitor C1, the third source electrode SE3, and the fourth drain electrode DE4 may be electrically connected to the first alignment electrode ALE1 through the first contact portion CNT1 and may be electrically connected to the first electrode ELT1 through the first alignment electrode ALE1.

The first drain electrode DE1 may be electrically connected to the first power line PL1. For example, the first drain electrode DE1 may be electrically connected to the first power line PL1 through at least one contact hole CH.

The bottom metal layer BML may overlap the first semiconductor pattern SCP1 and the first gate electrode GE1. In an embodiment, the bottom metal layer BML may be electrically connected to the first source electrode SE1 through at least one contact hole CH.

The second transistor M2 may include a second semiconductor pattern SCP2, a second gate electrode GE2, a second source electrode SE2, and a second drain electrode DE2.

The second semiconductor pattern SCP2 may overlap the second gate electrode GE2 and may be electrically connected to the second source electrode SE2 and the second drain electrode DE2. For example, both end portions of the second semiconductor pattern SCP2 may be electrically connected to the second source electrode SE2 and the second drain electrode DE2 through respective contact holes CH.

The second gate electrode GE2 may be electrically connected to the scan line SL. For example, the second gate electrode GE2 may be electrically connected to the scan line SL through at least one contact hole CH.

The second source electrode SE2 may be electrically connected to the first electrode CE1_1 of the first capacitor C1 and the first gate electrode GE1. For example, the second source electrode SE2 may be electrically connected to the first electrode CE1_1 of the first capacitor C1 and the first gate electrode GE1 through at least one contact hole CH.

The second drain electrode DE2 may be electrically connected to any first data line DL1. For example, the second drain electrode DE2 may be electrically connected to the (1_1)-th data line D1_1 through at least one contact hole CH.

The third transistor M3 may include a third semiconductor pattern SCP3, a third gate electrode GE3, a third source electrode SE3, and a third drain electrode DE3.

The third semiconductor pattern SCP3 may overlap the third gate electrode GE3 and may be electrically connected to the third source electrode SE3 and the third drain electrode DE3. For example, both end portions of the third semiconductor pattern SCP3 may be electrically connected to the third source electrode SE3 and the third drain electrode DE3 through respective contact holes CH.

The third gate electrode GE3 may be electrically connected the scan line SL (or the separate control line SSL separated from the scan line SL). In an embodiment, the third gate electrode GE3 may be integrally electrically connected to the second gate electrode GE2 and may be electrically connected to the scan line SL through at least one contact hole CH.

The third source electrode SE3 may be electrically connected to the second electrode CE1_2 of the first capacitor C1 and the first source electrode SE1. For example, the third source electrode SE3 may be integrally electrically connected to the second electrode CE1_2 of the first capacitor C1 and the first source electrode SE1.

The third drain electrode DE3 may be electrically connected to the initialization power line INL. For example, the third drain electrode DE3 may be electrically connected to the initialization power line INL through at least one contact hole CH.

The first capacitor C1 may include the first electrode CE1_1 and the second electrode CE1_2.

The first electrode CE1_1 of the first capacitor C1 may be electrically connected to the first gate electrode GE1 and the second source electrode SE2. For example, the first electrode CE1_1 of the first capacitor C1 may be integrally electrically connected to the first gate electrode GE1 and may be electrically connected to the second source electrode SE2 through at least one contact hole CH.

The second electrode CE1_2 of the first capacitor C1 may be electrically connected to the first source electrode SE1, the third source electrode SE3, and the fourth drain electrode DE4. For example, the second electrode CE1_2 of the first capacitor C1 may be integrally electrically connected to the first source electrode SE1, the third source electrode SE3, and the fourth drain electrode DE4.

The fourth transistor M4 may include a fourth semiconductor pattern SCP4, a fourth gate electrode GE4, a fourth source electrode SE4, and a fourth drain electrode DE4. In an embodiment, a light blocking pattern LBP may be disposed under the fourth transistor M4. For example, the light blocking pattern LBP may be disposed on the first conductive layer of the pixel circuit layer PCL to overlap the fourth source electrode SE4.

The fourth semiconductor pattern SCP4 may overlap the fourth gate electrode GE4 and may be electrically connected to the fourth source electrode SE4 and the fourth drain electrode DE4. For example, both end portions of the fourth semiconductor pattern SCP4 may be electrically connected to the fourth source electrode SE4 and the fourth drain electrode DE4 through respective contact holes CH.

The fourth gate electrode GE4 may be electrically connected to a first electrode CE2_1 of the second capacitor C2 and a fifth source electrode SE5. For example, the fourth gate electrode GE4 may be integrally electrically connected to the first electrode CE2_1 of the second capacitor C2 and may be electrically connected to the fifth source electrode SE5 through at least one contact hole CH.

The fourth source electrode SE4 may be electrically connected to a second electrode CE2_2 of the second capacitor C2. For example, the fourth source electrode SE4 may be integrally electrically connected to the second electrode CE2_2 of the second capacitor C2. The fourth source electrode SE4 may be electrically connected to the third electrode ELT3 formed in the display layer DPL through the third contact portion CNT3. For example, the fourth source electrode SE4 and the second electrode CE2_2 of the second capacitor C2 may be electrically connected to the third alignment electrode ALE3 through the third contact portion CNT3 and may be electrically connected to the third electrode ELT3 through the third alignment electrode ALE3.

The fourth drain electrode DE4 may be electrically connected to the first source electrode SE1. For example, the fourth drain electrode DE4 may be integrally electrically connected to the first source electrode SE1.

The fifth transistor M5 may include a fifth semiconductor pattern SCP5, a fifth gate electrode GE5, a fifth source electrode SE5, and a fifth drain electrode DE5.

The fifth semiconductor pattern SCP5 may overlap the fifth gate electrode GE5 and may be electrically connected to the fifth source electrode SE5 and the fifth drain electrode DE5. For example, both end portions of the fifth semiconductor pattern SCP5 may be electrically connected to the fifth source electrode SE5 and the fifth drain electrode DE5 through respective contact holes CH.

The fifth gate electrode GE5 may be electrically connected to the scan line SL. For example, the fifth gate electrode GE5 may be electrically connected to the scan line SL through at least one contact hole CH.

The fifth source electrode SE5 may be electrically connected to the first electrode CE2_1 of the second capacitor C2 and the fourth gate electrode GE4. For example, the fifth source electrode SE5 may be electrically connected to the first electrode CE2_1 of the second capacitor C2 and the fourth gate electrode GE4 through at least one contact hole CH.

The fifth drain electrode DE5 may be electrically connected to any second data line D2. For example, the fifth drain electrode DE5 may be electrically connected to the (2_1)-th data line D2_1 through at least one contact hole CH.

The second capacitor C2 may include the first electrode CE2_1 and the second electrode CE2_2.

The first electrode CE2_1 of the second capacitor C2 may be electrically connected to the fourth gate electrode GE4 and the fifth source electrode SE5. For example, the first electrode CE2_1 of the second capacitor C2 may be integrally electrically connected to the fourth gate electrode GE4 and may be electrically connected to the fifth source electrode SE5 through at least one contact hole CH.

The second electrode CE2_2 of the second capacitor C2 may be electrically connected to the fourth source electrode SE4. For example, the second electrode CE2_2 of the second capacitor C2 may be integrally electrically connected to the fourth source electrode SE4.

Referring to FIGS. 6 and 14, the second power line PL2 may include the first sub-power line PL2_1 and the second sub-power line PL2_2 separated from each other. The first sub-power line PL2_1 may be electrically connected to the second electrode ELT2 of the display layer DPL through the second contact portion CNT2. The second sub-power line PL2_2 may be electrically connected to the fourth electrode ELT4 of the display layer DPL through a fourth contact portion CNT4.

Referring to FIGS. 9 and 15, the scan line SL may include the first scan line SL1 and the second scan line SL2 separated from each other. The first scan line SL1 may be electrically connected to the second gate electrode GE2 and the third gate electrode GE3. The second scan line SL2 may be electrically connected to the fifth gate electrode GE5. In an embodiment, the display device DD may further include first and second sub scan lines SLV1 and SLV2 intersecting the first and second scan lines SL1 and SL2. The first scan line SL1 may be electrically connected to the first sub scan line SLV1, and the second scan line SL2 may be electrically connected to the second sub scan line SLV2. The first data line DL1 (for example, the (1_1)-th data line D1_1) may be electrically connected to the second drain electrode DE2 and the fifth drain electrode DE5.

Referring to FIGS. 10 and 16, the second power line PL2 may include the first sub-power line PL2_1 electrically connected to the second electrode ELT2 of the display layer DPL through the second contact portion CNT2, and the second sub-power line PL2_2 electrically connected to the fourth electrode ELT4 of the display layer DPL through the fourth contact portion CNT4. The scan line SL may include the first scan line SL1 electrically connected to the second gate electrode GE2 and the third gate electrode GE3, and the second scan line SL2 electrically connected to the fifth gate electrode GE5. The first data line DL1 may be electrically connected to the second drain electrode DE2 and the fifth drain electrode DE5.

In addition to the above-described embodiments, a structure of the pixel circuits PXC and the lines disposed in the pixel circuit layer PCL may be variously changed.

The display device DD including the pixel PXL according to the embodiment of FIG. 15 or 16 may not include the second data lines DL2 compared with the display device DD including the pixel PXL according to the embodiment of FIG. 13 or 14. Accordingly, the number of lines disposed in the display area DA may be reduced.

Figure 17:
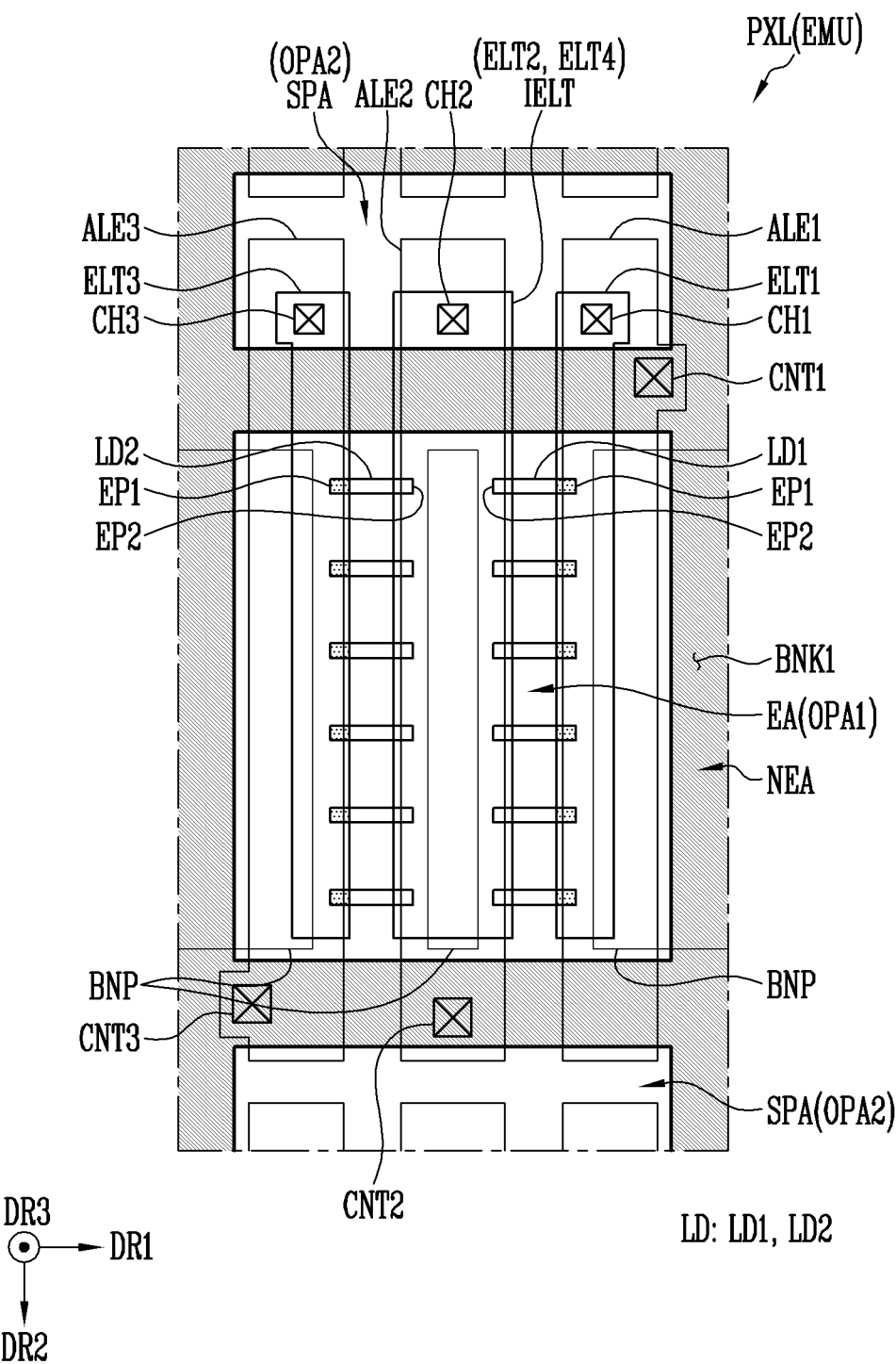
FIGS. 17 and 18 are plan views each schematically illustrating a pixel according to an embodiment of the disclosure.
Figure 18:
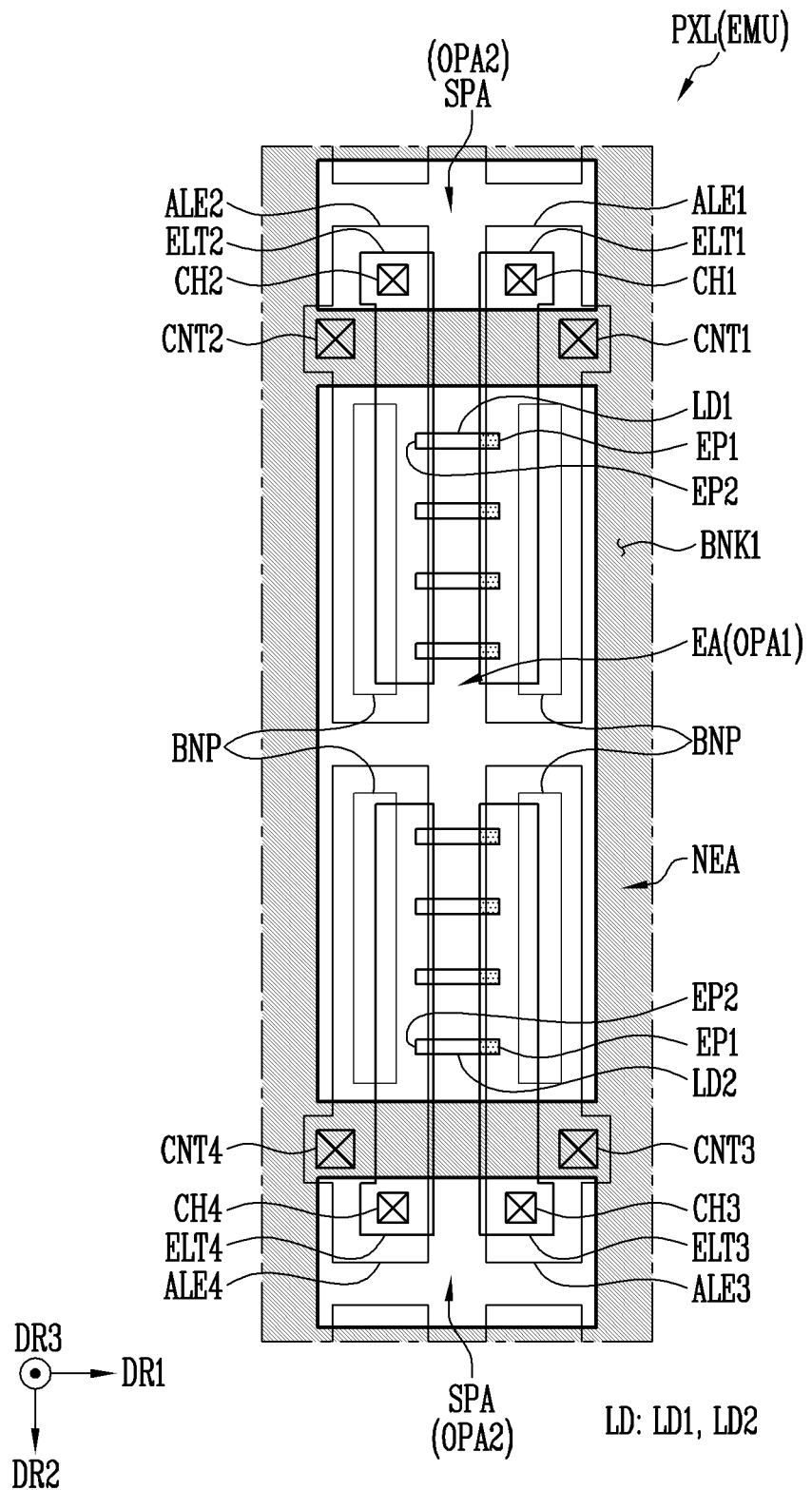

FIGS. 17 and 18 are schematic plan views each illustrating a pixel PXL according to an embodiment. For example, FIG. 17 illustrates the light emitting part EMU of the pixel PXL in which the second electrode ELT2 and the fourth electrode ELT4 configure one integrated electrode IELT as in the embodiment of FIG. 5, and FIG. 18 illustrates the light emitting part EMU of the pixel PXL in which the second electrode ELT2 and the fourth electrode ELT4 are separated from each other as in the embodiment of FIG. 6. Each light emitting part EMU shown in FIGS. 17 and 18 may be a configuration including the first light emitting part EMU1 and the second light emitting part EMU2. In the embodiments of FIGS. 17 and 18, the same reference numerals are assigned to elements similar or identical to those of the above-described embodiments, and a detailed description thereof is omitted. In an embodiment, the light emitting part EMU of the pixel PXL may be disposed in the display layer DPL of FIG. 12.

Referring to FIGS. 3 to 17, the pixel PXL may include the first to third alignment electrodes ALE1 to ALE3, the first to fourth electrodes ELT1 to ELT4, and the first and second light emitting elements LD1 and LD2 disposed in each pixel area of the display layer DPL. The pixel PXL may further include the bank patterns BNP disposed under the first to third alignment electrodes ALE1 to ALE3. The first to third alignment electrodes ALE1 to ALE3, the first to fourth electrodes ELT1 to ELT4, the first and second light emitting elements LD1 and LD2, and the bank patterns BNP may be disposed in the emission area EA, and at least some of those may extend to the non-emission area NEA and/or a separation area SPA.

The first bank BNK1 may be further provided in the display layer DPL. The first bank BNK1 may include a first opening OPA1 corresponding to each emission area EA and may further include a second opening OPA2 corresponding to each separation area SPA.

The first to third alignment electrodes ALE1 to ALE3 may be separated from each other. In an embodiment, the first to third alignment electrodes ALE1 to ALE3 may be spaced apart from each other in the first direction DR1, and each may extend in the second direction DR2. A size, a shape, the number, a position, and/or a mutual disposition structure of each of the first to third alignment electrodes ALE1 to ALE3 may be variously changed according to an embodiment.

The first alignment electrode ALE1 may be positioned around the first light emitting elements LD1 and may overlap the first electrode ELT1. The first alignment electrode ALE1 may be electrically connected to the first transistor M1 through the first contact portion CNT1 and may be electrically connected to the first electrode ELT1 through the first contact hole CH1. In an embodiment, the first contact portion CNT1 may be disposed in the non-emission area NEA, and the first contact hole CH1 may be disposed in the separation area SPA. However, the positions of the first contact unit (or first contact part) CNT1 and the first contact hole CH1 may be variously changed according to a design structure or the like of the pixel circuit PXC and the light emitting part EMU.

The first alignment electrodes ALE1 of the pixels PXL may be first formed to be electrically connected to each other to configure the first alignment line. After the alignment of the light emitting elements LD is completed, the first alignment line may be electrically disconnected (opened) in each separation area SPA. Accordingly, the first alignment electrodes ALE1 of the adjacent pixels PXL may be separated from each other.

The second alignment electrode ALE2 may be positioned around the first and second light emitting elements LD1 and LD2 and may overlap the integrated electrode IELT including the second and fourth electrodes ELT2 and ELT4. The second alignment electrode ALE2 may be electrically connected to the second power line PL2 through the second contact portion CNT2 and may be electrically connected to the integrated electrode IELT through the second contact hole CH2. In an embodiment, the second contact portion CNT2 may be disposed in the non-emission area NEA, and the second contact hole CH2 may be disposed in the separation area SPA. However, the position of the second contact portion CNT2 and the second contact hole CH2 may be variously changed according to the design structure or the like of the pixel circuit PXC and the light emitting part EMU.

The second alignment electrodes ALE2 of the pixels PXL may be first formed to be electrically connected to each other to configure the second alignment line. After the alignment of the light emitting elements LD is completed, the second alignment line may be electrically disconnected (opened) in each separation area SPA. Accordingly, the second alignment electrodes ALE2 of the adjacent pixels PXL may be separated from each other. As another example, the second alignment line may not be electrically disconnected even after the alignment of the light emitting elements LD is completed. In this case, the second alignment electrodes ALE2 of the pixels PXL may be integrally formed.

The third alignment electrode ALE3 may be positioned around the second light emitting elements LD2 and may overlap the third electrode ELT3. The third alignment electrode ALE3 may be electrically connected to the fourth transistor M4 through the third contact portion CNT3 and may be electrically connected to the third electrode ELT3 through the third contact hole CH3. In an embodiment, the third contact portion CNT3 may be disposed in the non-emission area NEA, and the third contact hole CH3 may be disposed in the separation area SPA. However, a position of the third contact portion CNT3 and the third contact hole CH3 may be variously changed according to the design structure or the like of the pixel circuit PXC and the light emitting part EMU.

The third alignment electrodes ALE3 of the pixels PXL may be first formed to be electrically connected to each other to configure the third alignment line. After the alignment of the light emitting elements LD is completed, the third alignment line may be electrically disconnected (opened) in each separation area SPA. Accordingly, the third alignment electrodes ALE3 of the adjacent pixels PXL may be separated from each other. In an embodiment, the third alignment line may be formed to be electrically connected to the first alignment line. In this case, the number of alignment signals used for the alignment of the light emitting elements LD may be reduced.

The first light emitting elements LD1 may be disposed between the first and second alignment electrodes ALE1 and ALE2. Here, a case where the first light emitting elements LD1 are disposed between the first and second alignment electrodes ALE1 and ALE2 means that at least one portion of each of the first light emitting elements LD1 is positioned in a region between the first and second alignment electrodes ALE1 and ALE2. Each first light emitting element LD1 may or may not overlap the first and/or second alignment electrode ALE1 and/or ALE2.

The first light emitting elements LD1 may be aligned with a directionality. For example, the first light emitting elements LD1 may be aligned so that the first end portions EP1 face the first alignment electrode ALE1, and the second end portions EP2 face the second alignment electrodes ALE2.

The second light emitting elements LD2 may be disposed between the second and third alignment electrodes ALE2 and ALE3. Here, a case where the second light emitting elements LD2 are disposed between the second and third alignment electrodes ALE2 and ALE3 means that at least one portion of each of the second light emitting elements LD2 is positioned in a region between the second and third alignment electrodes ALE2 and ALE3. Each second light emitting element LD2 may or may not overlap the second and/or third alignment electrode ALE2 and/or ALE3.

The second light emitting elements LD2 may be aligned with a directionality. For example, the second light emitting elements LD2 may be aligned so that the first end portions EP1 face the first alignment electrode ALE1, and the second end portions EP2 face the second alignment electrodes ALE2.

In an embodiment, each light emitting element LD (for example, the first light emitting element LD1 or the second light emitting element LD2) may be the light emitting element LD according to the embodiments of FIGS. 1 and 2. For example, each light emitting element LD may have a rod shape having a small size of a range from nanometer to micrometer. However, a type of the light emitting elements LD forming the light emitting part EMU is not limited thereto.

The first electrode ELT1, the integrated electrode IELT (the second and fourth electrodes ELT2 and ELT4), and the third electrode ELT3 may be separated from each other. In an embodiment, the first electrode ELT1, the integrated electrode IELT, and the third electrodes ELT3 may be spaced from each other in the first direction DR1, and each may extent in the second direction DR2. A size, a shape, the number, a position, and/or a mutual disposition structure of each of the first electrode ELT1, the integrated electrode IELT, and the third electrode ELT3 may be variously changed according to an embodiment.

The first electrode ELT1 may overlap the first alignment electrode ALE1 and may be electrically connected to the first alignment electrode ALE1 through the first contact hole CH1. The first electrode ELT1 may overlap the first end portions EP1 of the first light emitting elements LD1 and may be electrically connected to the first end portions EP1 of the first light emitting elements LD1.

The integrated electrode IELT may overlap the second alignment electrode ALE2 and may be electrically connected to the second alignment electrode ALE2 through the second contact hole CH2. The integrated electrode IELT may overlap the second end portions EP2 of the first and second light emitting elements LD1 and LD2 and may be electrically connected to the second end portions EP2 of the first and second light emitting elements LD1 and LD2.

The third electrode ELT3 may overlap the third alignment electrode ALE3 and may be electrically connected to the third alignment electrode ALE3 through the third contact hole CH3. The third electrode ELT3 may overlap the first end portions EP1 of the second light emitting elements LD2 and may be electrically connected to the first end portions EP1 of the second light emitting elements LD2.

Referring to FIGS. 3 to 18, the second electrode ELT2 and the fourth electrode ELT4 may be separated from each other. The second alignment electrode ALE2 may be disposed under the second electrode ELT2, and the fourth alignment electrode ALE4 may be disposed under the fourth electrode ELT4.

The second alignment electrode ALE2 may be electrically connected to the first sub-power line PL2_1 through the second contact portion CNT2. The second alignment electrode ALE2 may be electrically connected to the second electrode ELT2 through the second contact hole CH2.

The fourth alignment electrode ALE4 may be electrically connected to the second sub-power line PL2_2 through the fourth contact portion CNT4. The fourth alignment electrode ALE4 may be electrically connected to the fourth electrode ELT4 through the fourth contact hole CH4.

In an embodiment, the first and second alignment electrodes ALE1 and ALE2 may be spaced apart from each other in the first direction DR1. The third and fourth alignment electrodes ALE3 and ALE4 may be spaced apart from each other in the first direction DR1 and may be spaced apart from the first and second alignment electrodes ALE1 and ALE2 in the second direction DR2. The first to fourth electrodes ELT1 to ELT4 may overlap the first to fourth alignment electrodes ALE1 to ALE4, respectively.

In an embodiment, the first and third alignment electrodes ALE1 and ALE3 of the pixels PXL may be first formed to be electrically connected to each other to configure the first alignment line. After the alignment of the light emitting elements LD is completed, the first alignment line may be electrically disconnected between each separation area SPA and the first and second light emitting parts EMU1 and EMU2. Accordingly, the first and third alignment electrodes ALE1 and ALE3 of the pixels PXL may be formed as individual patterns.

Similarly, the second and fourth alignment electrodes ALE2 and ALE4 of the pixels PXL may be first formed to be electrically connected to each other to configure the second alignment line. After the alignment of the light emitting elements LD is completed, the second alignment line may be electrically disconnected between each separation area SPA and the first and second light emitting parts EMU1 and EMU2. Accordingly, the second and fourth alignment electrodes ALE2 and ALE4 of the pixels PXL may be formed as individual patterns.

A position, a mutual disposition structure, and the like of each of the first to fourth alignment electrodes ALE1 to ALE4 and the first to fourth electrodes ELT1 to ELT4 may be variously changed. A position of each of the first to fourth contact portions CNT1 to CNT4 and the first to fourth contact holes CH1 to CH4 may also be variously changed.

According to the above-described embodiments, each pixel PXL may include the first light emitting part EMU1 including the first light emitting element LD1 and the second light emitting part EMU2 including the second light emitting element LD2, and the ratio of the current flowing through the first light emitting part EMU1 and the second light emitting part EMU2 may be adjusted according to the grayscale value of the image data IMD corresponding to the pixel PXL. For example, in case that the grayscale value of the image data IMD corresponding to the pixel PXL is equal to or less than the first reference grayscale value, the driving current of the pixel PXL may be controlled to be concentrated to the first light emitting part EMU1. Accordingly, even though the pixel PXL is driven with a low luminance, light emission efficiency reduction and a color shift of the pixel PXL may be prevented or reduced. Accordingly, a low grayscale expression ability of the pixel PXL may be increased, and image quality of the display device DD may be improved.

In an embodiment, in case that the pixel PXL is driven with a high luminance, the ratio of the divided current supplied to the second light emitting part EMU2 may be increased. For example, in case that the grayscale value of the image data IMD corresponding to the pixel PXL is equal to or greater than the first reference grayscale value, the ratio of the driving current supplied to the first and second light emitting parts EMU1 and EMU2 may be adjusted so that the ratio of the driving current supplied to the second light emitting part EMU2 increases as the grayscale value of the image data IMD increases. Accordingly, a stress according to the light emission of the pixel PXL may be distributed to the first and second light emitting parts EMU1 and EMU2, and deterioration of the first and second light emitting elements LD1 and LD2 configuring the first and second light emitting parts EMU1 and EMU2 may be uniform. Accordingly, an image quality reduction of the display device DD according to the deterioration of the pixel PXL may be prevented or reduced.

Although the technical idea of the disclosure has been described in detail in accordance with the above-described embodiments, it should be noted that the above-described embodiments are for the purpose of description and not of limitation. In addition, those skilled in the art may understand that various modifications are possible within the scope of the technical spirit of the disclosure.

The scope of the disclosure is not limited to the details described in the detailed description of the specification, but should be defined by the claims. In addition, it is to be construed that all changes or modifications derived from the meaning and scope of the claims and equivalent concepts thereof are included in the scope of the disclosure.

What is claimed is:

1. A display device comprising:
 a data driver that outputs a first data signal and a second data signal of different voltages in response to image data of each frame; and
 a pixel that emits light in response to the first data signal and the second data signal,
 wherein the pixel comprises:
  a current generator electrically connected between a first power source and a first node and generating a driving current corresponding to the first data signal;
  a first light emitting part including:
   a first electrode electrically connected to the first node;
   a second electrode electrically connected to a second power source; and
   a first light emitting element electrically connected between the first electrode and the second electrode;
  a second light emitting part including:
   a third electrode electrically connected to the first node and separated from the first electrode;
   a fourth electrode electrically connected to the second power source; and
   a second light emitting element electrically connected between the third electrode and the fourth electrode; and
  a current controller electrically connected between the first node and the second light emitting part, and controlling a divided current supplied to the second light emitting part in response to the second data signal.

2. The display device according to claim 1, wherein the data driver changes a voltage of the first data signal and a voltage of the second data signal according to a grayscale value of image data corresponding to the pixel.

3. The display device according to claim 2, wherein
 in case that the image data corresponding to the pixel has a first grayscale value, the data driver generates a first voltage and a second voltage as the first data signal and the second data signal, respectively,
 in case that the image data corresponding to the pixel has a second grayscale value greater than the first grayscale value, the data driver generates a third voltage and a fourth voltage as the first data signal and the second data signal, respectively,
 an amplitude of the third voltage is greater than an amplitude of the first voltage, and
 an amplitude of the fourth voltage is greater than an amplitude of the second voltage.

4. The display device according to claim 1, wherein the data driver generates the first data signal using the image data and a first gamma voltage, and generates the second data signal using the image data and a second gamma voltage.

5. The display device according to claim 1, wherein the current generator comprises:
 a first transistor electrically connected between the first power source and the first node and generating the driving current in response to a voltage of a second node;
 a second transistor electrically connected between a first data line to which the first data signal is supplied and the second node, and turned on by a first scan signal;
 a third transistor electrically connected between the first node and an initialization power line, and turned on by the first scan signal or a control signal; and
 a first capacitor electrically connected between the first node and the second node.

6. The display device according to claim 5, wherein the current controller comprises:
 a fourth transistor electrically connected between the first node and the second light emitting part and controlling the divided current in response to a voltage of a third node;
 a fifth transistor that supplies the second data signal to the third node; and
 a second capacitor electrically connected between an electrode of the fourth transistor and the third node.

7. The display device according to claim 6, wherein the fifth transistor is electrically connected between a second data line to which the second data signal is supplied and the third node, and is turned on by the first scan signal.

8. The display device according to claim 6, wherein the fifth transistor is electrically connected between the first data line and the third node, and is turned on by a second scan signal.

9. The display device according to claim 8, further comprising:
a first scan line electrically connected to a gate electrode of the second transistor;
a second scan line electrically connected to a gate electrode of the fifth transistor; and
a scan driver sequentially outputting the first scan signal and the second scan signal to the first scan line and the second scan line.

10. The display device according to claim 9, wherein the data driver sequentially outputs the first data signal and the second data signal to the first data line.

11. The display device according to claim 6, wherein the data driver generates the second data signal as an off-voltage of the fourth transistor in case that a grayscale value of image data corresponding to the pixel is equal to or less than a reference grayscale value.

12. The display device according to claim 1, wherein the second electrode and the fourth electrode are integral with each other.

13. The display device according to claim 1, wherein the second power source includes:
a first sub-power source supplying second power of a first potential; and
a second sub-power source supplying second power of a second potential lower than the first potential, and
the second electrode and the fourth electrode are separated from each other and are electrically connected to the first sub-power source and the second sub-power source, respectively.

14. A pixel comprising:
a current generator electrically connected between a first power source and a first node and generating a driving current corresponding to a first data signal;
a first light emitting part including:
a first electrode electrically connected to the first node;
a second electrode electrically connected to a second power source; and
a first light emitting element electrically connected between the first electrode and the second electrode;
a second light emitting part including:
a third electrode electrically connected to the first node and separated from the first electrode;
a fourth electrode electrically connected to the second power source, and
a second light emitting element electrically connected between the third electrode and the fourth electrode; and a current controller electrically connected between the first node and the second light emitting part and controlling a divided current supplied to the second light emitting part in response to a second data signal.

15. The pixel according to claim 14, wherein the current generator comprises:
a first transistor electrically connected between the first power source and the first node and generating the driving current in response to a voltage of a second node;
a second transistor electrically connected between a first data line to which the first data signal is supplied and the second node, and turned on by a first scan signal;
a third transistor electrically connected between the first node and an initialization power line, and turned on by the first scan signal or a control signal; and
a first capacitor electrically connected between the first node and the second node.

16. The pixel according to claim 15, wherein the current controller comprises:
a fourth transistor electrically connected between the first node and the second light emitting part and controlling the divided current in response to a voltage of a third node;
a fifth transistor that supplies the second data signal to the third node; and
a second capacitor electrically connected between an electrode of the fourth transistor and the third node.

17. The pixel according to claim 16, wherein the fifth transistor is electrically connected between a second data line to which the second data signal is supplied and the third node, and is turned on by the first scan signal.

18. The pixel according to claim 16, wherein the fifth transistor is electrically connected between the first data line and the third node, and is turned on by a second scan signal.

19. The pixel according to claim 14, wherein the second electrode and the fourth electrode are integral with each other.

20. The pixel according to claim 14, wherein
the second power source includes:
a first sub-power source supplying second power of a first potential; and
a second sub-power source supplying second power of a second potential lower than the first potential, and
the second electrode and the fourth electrode are separated from each other and are electrically connected to the first sub-power source and the second sub-power source, respectively.

* * * * *